(12) United States Patent
Park et al.

(10) Patent No.: US 11,824,061 B2
(45) Date of Patent: Nov. 21, 2023

(54) DISPLAY DEVICE AND METHOD OF MANUFACTURING THE SAME

(71) Applicant: Samsung Display Co., LTD., Yongin-si (KR)

(72) Inventors: Joon Seok Park, Yongin-si (KR); Tae Sang Kim, Seoul (KR); Yeon Keon Moon, Hwaseong-si (KR); Geun Chul Park, Suwon-si (KR); Jun Hyung Lim, Seoul (KR); Kyung Jin Jeon, Incheon (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/783,002

(22) Filed: Feb. 5, 2020

(65) Prior Publication Data

US 2020/0286927 A1 Sep. 10, 2020

(30) Foreign Application Priority Data

Mar. 5, 2019 (KR) .......................... 10-2019-0025157

(51) Int. Cl.
*H01L 27/12* (2006.01)

(52) U.S. Cl.
CPC ........ *H01L 27/1225* (2013.01); *H01L 27/124* (2013.01); *H01L 27/127* (2013.01); *H01L 27/1251* (2013.01)

(58) Field of Classification Search
CPC ............... H01L 27/1225; H01L 27/124; H01L 27/1251; H01L 27/127

(Continued)

(56) References Cited

U.S. PATENT DOCUMENTS 7,825,406 B2 * 11/2010 Yoshida .............. H01L 27/1214
257/40
9,818,765 B2 11/2017 Osawa et al.
(Continued)

FOREIGN PATENT DOCUMENTS

KR 10-2018-0026610 3/2018
KR 10-2018-0061723 3/2018
(Continued)

OTHER PUBLICATIONS

Chen, Rongsheng, et al. "Self-Aligned Top-Gate InGaZnO Thin Film Transistors Using SIO2/Al2O3 Stack Gate Dielectric." Thin Solid Films, vol. 548, 2013, pp. 572-575., Sep. 17, 2013.

*Primary Examiner* — Ori Nadav
(74) *Attorney, Agent, or Firm* — H.C. Park & Associates, PLC

(57) ABSTRACT

A display device includes a plurality of pixels respectively coupled to scan lines and data lines intersecting the scan lines, wherein at least some of the pixels includes a driving transistor including a substrate, a first insulating layer disposed on the substrate, a first active layer disposed on the first insulating layer, a first gate electrode disposed on the first active layer, and a first source electrode and a first drain electrode electrically connected to the first active layer, the first drain electrode being spaced apart from the first source electrode by a first distance, and a switching transistor including a second gate electrode disposed between the substrate and the first insulating layer, a second active layer disposed on the same layer as the first active layer, and a second source electrode and a second drain electrode electrically connected to the second active layer, the second drain electrode being spaced apart from the second source electrode by a second distance different from the first distance.

12 Claims, 27 Drawing Sheets

(58) Field of Classification Search
USPC .......................................................... 257/72
See application file for complete search history.

(56) References Cited

U.S. PATENT DOCUMENTS

| | | | |
|---|---|---|---|
| 10,290,658 B2 * | 5/2019 | Koo | ................... H01L 27/1251 |
| 10,340,472 B2 | 7/2019 | Kim et al. | |
| 10,761,364 B2 * | 9/2020 | Akiyoshi | .......... G02F 1/136227 |
| 2005/0262293 A1 * | 11/2005 | Yoon | ................... G09G 3/3275 |
| | | | 711/104 |
| 2007/0035225 A1 * | 2/2007 | Lee | ..................... H01L 27/3272 |
| | | | 313/111 |
| 2015/0255523 A1 * | 9/2015 | Her | ..................... H01L 27/3262 |
| | | | 345/76 |
| 2015/0371589 A1 * | 12/2015 | Kim | ....................... G09G 3/325 |
| | | | 345/208 |
| 2018/0151654 A1 | 5/2018 | Lee | |
| 2018/0277614 A1 * | 9/2018 | Ono | ................... H01L 27/1248 |
| 2018/0357964 A1 * | 12/2018 | Shin | ..................... G09G 3/3233 |
| 2019/0214447 A1 * | 7/2019 | Kim | ................... H01L 27/3265 |

FOREIGN PATENT DOCUMENTS

| KR | 10-2018-0061720 | 6/2018 |
|---|---|---|
| KR | 10-2018-0070334 | 6/2018 |
| KR | 10-2018-0097782 | 8/2018 |
| KR | 10-1901251 | 9/2018 |

\* cited by examiner

DISPLAY DEVICE AND METHOD OF MANUFACTURING THE SAME

CROSS REFERENCE TO RELATED APPLICATION

This application claims priority from and the benefit of Korean Patent Application No. 10-2019-0025157, filed on Mar. 5, 2019, which is hereby incorporated by reference for all purposes as if fully set forth herein.

BACKGROUND

Field

Exemplary implementations of the invention relate generally to a display device and, more specifically, to a display device having a pixel transistor and/or a scan driver with narrow width and a method of manufacturing the display device.

Description of the Background

As the information society develops, the demand for display devices for displaying images is increasing in various forms. Accordingly, various display devices such as liquid crystal displays (LCDs), plasma display panels (PDPs), and light emitting displays are being utilized. Light emitting displays include organic light emitting displays using organic light emitting diodes as light emitting elements and light emitting diode displays using micro-light emitting diodes as light emitting elements.

Such a flat panel display device includes a display panel, a gate driver circuit, a data driver circuit, and a timing controller. The display panel includes data lines, gate lines, and pixels formed at intersections of the data lines and the gate lines. By using a thin-film transistor as a switching element, each of the pixels receives a data voltage from a data line when a gate signal is supplied to a gate line. Each of the pixels emits light of a predetermined brightness according to the data voltage.

Recently, flat panel display devices capable of displaying images with a high resolution of ultra-high definition (UHD) are being released, and flat panel display de ices capable of displaying images with a high resolution of 8K UHD are being developed. The UM represents a resolution of 3840×2160 and 8K UHD represents a resolution of 7680×4320.

The above information disclosed in this Background section is only for understanding of the background of the inventive concepts, and, therefore, it may contain information that does not constitute prior art.

SUMMARY

Applicant discovered that in the case of a high-resolution flat panel display device as discussed above, the area for the scan driver circuit and the thin-film transistor in each pixel may be too large to be accommodated in the display device as the number of pixels increases.

Display devices constructed according to the principles and exemplary implementations of the invention and methods of manufacturing the same according to the principles of the invention are capable of reducing widths of at least one transistor in a scan driver circuit and of the switching transistors in each pixel without complicating manufacture, e.g., without increasing the number of masks typically used in manufacturing processes of display devices. For example, according to some implementations of display devices of the invention, it is possible to ensure process economics by maintaining the number of masks, to realize a narrow bezel by reducing the total width of a scan driver circuit, and to realize a high-resolution display device by reducing the area of the switching transistor in each pixel.

Additional features of the inventive concepts will be set forth in the description which follows, and in part will be apparent from the description, or may be learned by practice of the inventive concepts.

According to one aspect of the invention, a display device includes a plurality of pixels respectively coupled to scan lines and data lines intersecting the scan lines, wherein at least some of the pixels include a driving transistor including a substrate, a first insulating layer disposed on the substrate, a first active layer disposed on the first insulating layer, a first gate electrode disposed on the first active layer, and a first source electrode and a first drain electrode electrically connected to the first active layer, the first drain electrode being spaced apart from the first source electrode by a first distance, and a switching transistor including a second gate electrode disposed between the substrate and the first insulating layer, a second active layer disposed on the same layer as the first active layer, and a second source electrode and a second drain electrode electrically connected to the second active layer, the second drain electrode being spaced apart from the second source electrode by a second distance different from the first distance.

The first active layer and the second active layer may include indium-gallium-zinc oxide or indium-tin-zinc oxide.

The first active layer may include a first source region, a first drain region and a first channel region disposed between the first source region and the first drain region, and the second active layer may include a second source region, a second drain region and a second channel region disposed between the second source region and the second drain region.

A length of the first active layer in a first direction may be greater than that of the second active layer in the first direction.

The first active layer and the second active layer may directly contact the first insulating layer.

The driving transistor may further include a top gate structure having a first metal layer disposed between the substrate and the first insulating layer, and the first metal layer and the second gate electrode comprise the same material.

The driving transistor may further include a second insulating layer disposed on the first gate electrode. The first source electrode may be connected to the first source region of the first active layer through a first contact hole passing through the second insulating layer; and the first drain electrode may be connected to the first drain region of the first active layer through a second contact hole passing through the second insulating layer.

The first source electrode may contact the first metal layer through a fifth contact hole passing through the first insulating layer and the second insulating layer.

The driving transistor may further include a first gate insulating layer disposed between the first gate electrode and the first active layer, and the first gate electrode contacts the first metal layer through a sixth contact hole passing through the first insulating layer and the first gate insulating layer.

The second insulating layer may not overlap the second active layer of the switching transistor.

The switching transistor may include a bottom gate structure in which the second source electrode may contact the second source region of the second active layer and the second drain electrode contact the second drain region of the second active layer. The first distance between the first source electrode and the first drain electrode in the first direction may be greater than the second distance between the second source electrode and the second drain electrode in the first direction.

The second insulating layer may further include a third contact hole and a fourth contact hole which at least partially overlap the second active layer of the switching transistor and pass through the second insulating layer. The second source electrode may be connected to the second source region of the second active layer through the third contact hole and the second drain electrode may be connected to the second drain region of the second active layer through the fourth contact hole.

The first distance between the first source electrode and the first drain electrode in the first direction may be greater than the second distance between the second source electrode and the second drain electrode in the first direction.

The display device may further include a scan driver circuit to output a scan signal to the scan lines, wherein the scan driver circuit may include a pull-up transistor to output a gate-on voltage when a pull-up node is charged with the gate-on voltage. The pull-up transistor may have a third gate electrode disposed between the substrate and the first insulating layer and a third active layer disposed on the same layer as the first active layer.

The third active layer may include indium-gallium-zinc oxide or indium-tin-zinc oxide.

The driving transistor may further include a second insulating layer disposed on the first gate electrode, and the second insulating layer may not overlap the third active layer of the pull-up transistor.

According to another aspect of the invention, a method of manufacturing a display device includes the steps of: forming a first metal layer and a second gate electrode on a substrate; forming a first insulating layer on the first metal layer and the second gate electrode; forming a first active layer and a second active layer of an oxide semiconductor material on the first insulating layer; forming a first gate insulating layer and a first gate electrode on the first active layer; forming a second insulating layer, which comprises a first contact hole and a second contact hole, on the first gate electrode; and forming a first source electrode and a first drain electrode on the first gate electrode and forming a second source electrode and a second drain electrode on the second active layer, with the distance between the first source electrode and the first drain electrode being different from the distance between the second source electrode and the second drain electrode.

The first active layer and the second active layer may be made of indium-gallium-zinc oxide or indium-tin-zinc oxide.

The step of forming of the second insulating layer may include the steps of depositing an inorganic layer on the entire surface of the first insulating layer and etching the inorganic layer to expose the second active layer.

The second active layer may include a second source region, a second drain region and a second channel region disposed between the second source region and the second drain region. The step of forming of the second insulating layer may include the steps of: depositing an inorganic layer on the entire surface of the first insulating layer and forming a third contact hole which exposes the second source region of the second active layer and a fourth contact hole which exposes the second drain region of the second active layer by etching the inorganic layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
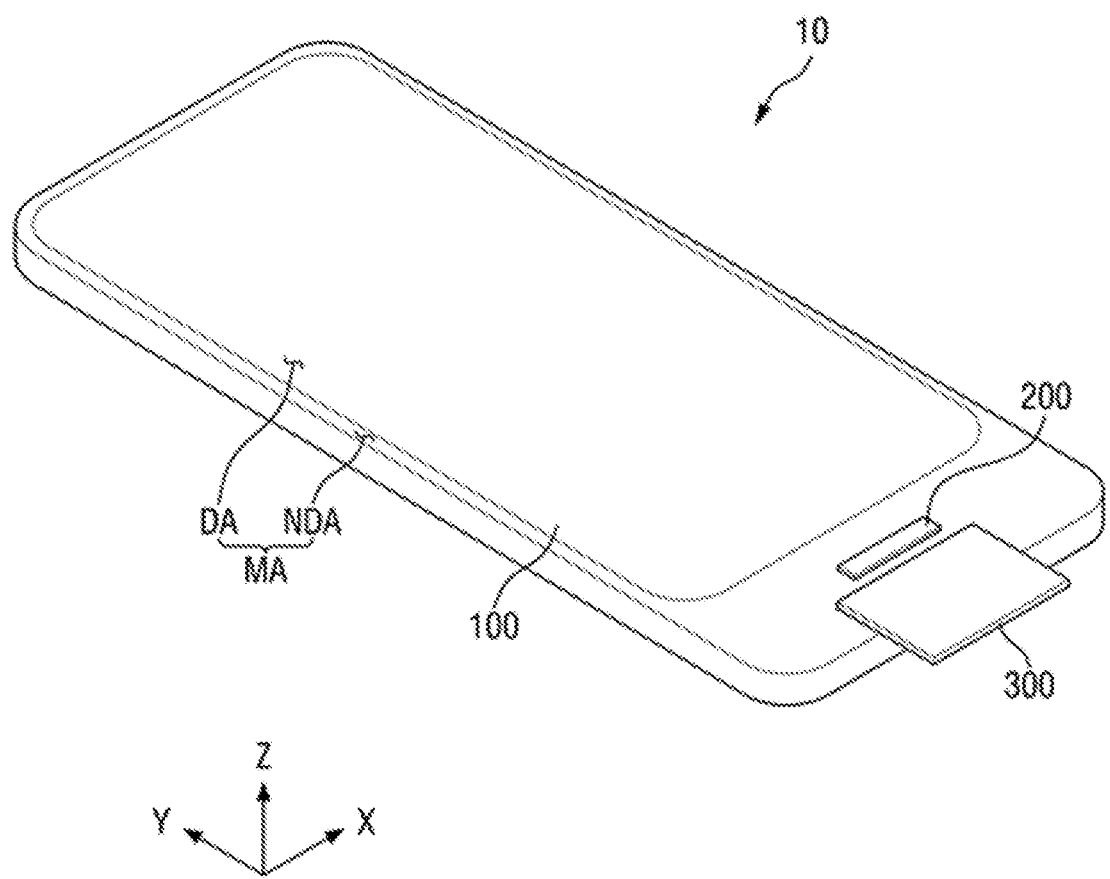
FIG. 1 is a perspective view of an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, specific exemplary embodiments will be described with reference to the attached drawings.

Figure 2:
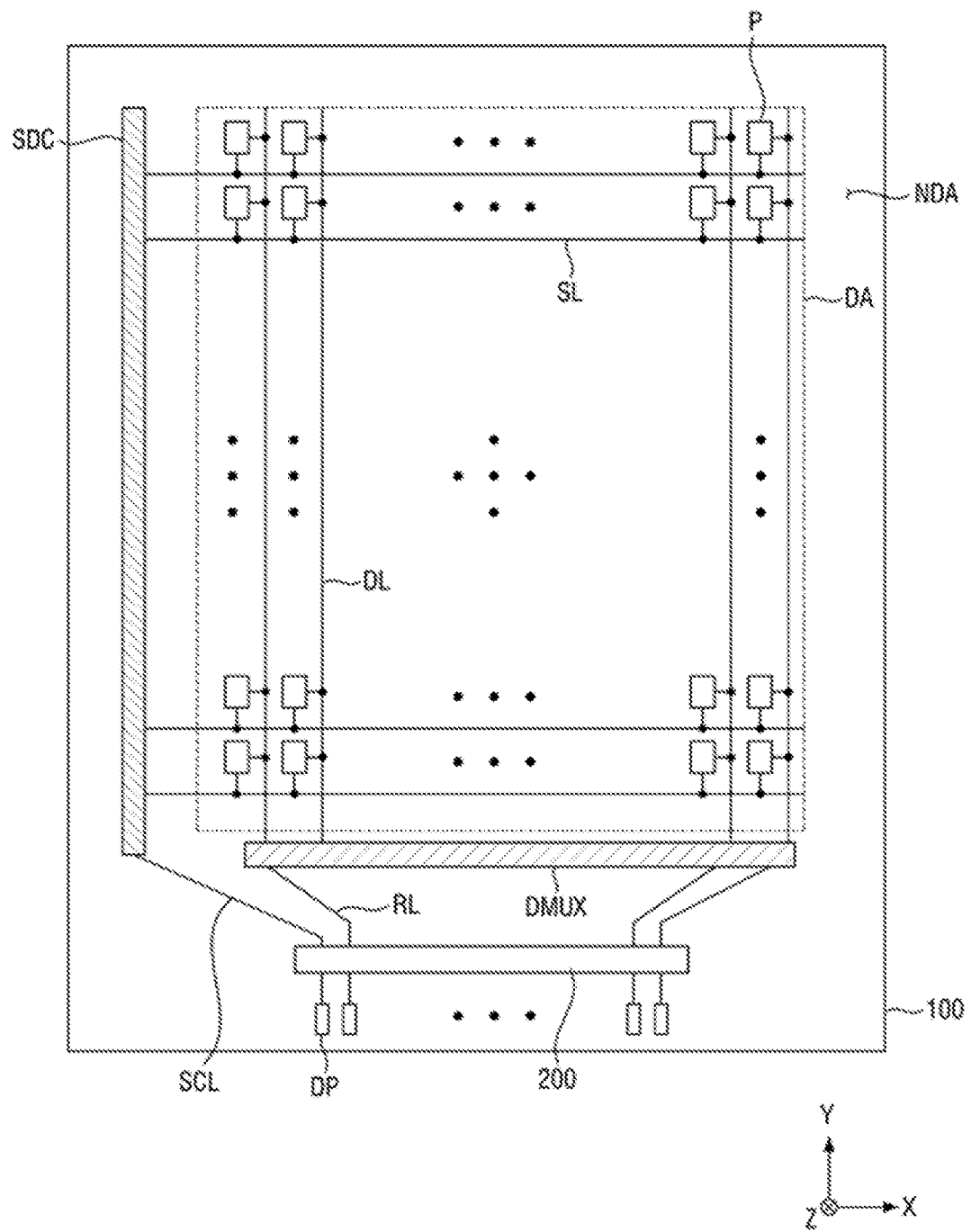
FIG. 2 is a plan view of the interior of the display device of FIG. 1 schematically illustrating some of its internal components.
Figure 3:
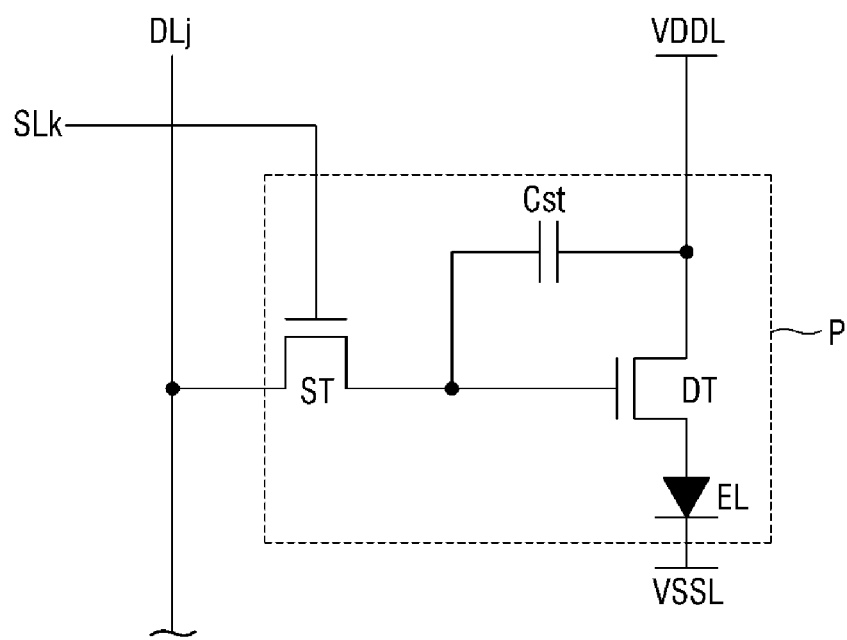
FIG. 3 is an equivalent circuit diagram of a representative pixel of the display device shown in FIG. 2.

FIG. 1 is a perspective view of an exemplary embodiment of a display device 10 constructed according to the principles of the invention. FIG. 2 is a plan view of the interior of the display device of FIG. 1 schematically illustrating some of its internal component. FIG. 3 is an equivalent circuit diagram of a representative pixel of the display device shown in FIG. 2.

Throughout the specification, the terms "on", "top" and "upper surface" indicate an upward direction from a display panel 100, that is, a Z-axis direction, and the terms "under," "bottom" and "lower surface" indicate a downward direction from the display panel 110, that is, a direction opposite to the Z-axis direction. In addition, "left," "right," "up" and "down" indicate directions when the display panel 100 is viewed in a plane. For example, "left" indicates a direction opposite to an X-axis direction, "right" indicates the X-axis direction, "up" indicates a Y-axis direction, and "down" indicates a direction opposite to the Y-axis direction.

Referring to FIGS. 1 and 2, the display device 10 is a device for displaying moving images or still images. The display device 10 may be used as a display screen in portable electronic devices such as a mobile phone, a smartphone, a tablet personal computer (PC), a smart watch, a watch phone, a mobile communication terminal, an electronic notebook, an electronic book, a portable multimedia player (PMP), a navigation system and a ultra-mobile PC (UMPC), as well as in various products such as a television, a notebook computer, a monitor, a billboard and the Internet of things (IoT). The display device 10 may be any one of an organic light emitting display, a liquid crystal display, a plasma display, a field emission display, an electrophoretic display, an electrowetting display, a quantum dot light emitting display, a micro light emitting diode (LED) display and any other displays known in the art. An organic light emitting display will hereinafter be described as an example of the display device 10, but exemplary embodiments are not limited to an organic light emitting display.

The display device 10 according to the exemplary embodiment includes the display panel 100, a display driver circuit 200, and a circuit board 300.

The display panel 100 may be formed in a rectangular plane having short sides in a first direction (X-axis direction) and long sides in a second direction (Y-axis direction). Each corner where a long side extending in the first direction (X-axis direction) meets a short side extending in the second direction (Y-axis direction) may be rounded with a predetermined curvature or may be right-angled. The planar shape of the display panel 100 is not limited to a rectangular shape, but may also be another polygonal shape, a circular shape, or an elliptical shape. The display panel 100 may be formed flat. However, the display panel 100 is not limited to this example and may also include a curved portion formed at its left and right ends and having a constant curvature or a varying curvature. In addition, the display panel 100 may be formed flexible so that it can be curved, bent, folded, or rolled.

The display panel 100 may include a display area DA where a plurality of pixels P are formed to display an image and a non-display area NDA disposed around the display area DA. When the display panel 100 includes a curved portion, the display area DA may also be disposed in the curved portion. In this case, an image may also be displayed on the curved portion of the display panel 100.

In the display area DA, not only are the pixels P disposed but also scan lines SL, data lines DL and power supply lines connected to the pixels P may be disposed. The scan lines SL may be formed substantially parallel to each other in the first direction (X-axis direction), and the data lines DL may be formed substantially parallel to each other in the second direction (Y-axis direction) intersecting the first direction (X-axis direction). Each of the pixels P may be connected to at least any one of the scan lines SL and any one of the data lines DL.

Referring to FIGS. 2 and 3, each of the pixels P may include a driving transistor DT, at least one switching transistor ST, a light emitting element EL, and a capacitor Cst. Since the switching transistor ST is turned on by a scan signal received from a scan line SL, the data voltage of a data line DL may be applied to a gate electrode of the driving transistor DT. The driving transistor DT may supply a driving current to the light emitting element EL according to the data voltage applied to the gate electrode, thereby causing the light emitting element EL to emit light. The driving transistor DT and the at least one switching transistor ST may be thin-film transistors. The light emitting element EL may emit light according to the driving current of the driving transistor DT. The light emitting element EL may be an organic light emitting diode including a first electrode, an organic light emitting layer, and a second electrode. The capacitor Cst may maintain the data voltage applied to the gate electrode of the driving transistor DT constant.

Referring to FIGS. 1 and 2, the non-display area NDA may be defined as an area extending from the outside of the display area DA to edges of the display panel 100. In the non-display area NDA, a scan driver circuit SDC for transmitting scan signals to the scan lines SL and a data voltage distribution circuit DMUX connected between the data lines DL and routing lines RL may be disposed. In addition, pads DP electrically connected to the display drier circuit 200 and the circuit board 300 may be disposed in the non-display area NDA. In this case, the display driver circuit 200 and the pads DP may be disposed on an edge of the display panel 100.

The scan driver circuit SDC may be connected to the display driver circuit 200 through at least one scan control line SCL. The scan driver circuit SDC may receive a scan control signal from the display driver circuit 200 through the at least one scan control line SCL. The scan driver circuit SDC may generate scan signals according to the scan control signal and sequentially output the scan signals to the scan lines SL. Although the scan driver circuit SDC is formed in the non-display area NDA on a side (e.g., a left side) of the display area DA in FIG. 2, exemplary embodiments are not limited to this case. For example, the scan driver circuit SDC may also be formed in the non-display area NDA on both sides (e.g., left and right sides) of the display area DA.

The data voltage distribution circuit DMUX may be connected between the routing lines RL and the data lines DL. A ratio of the number of the routing lines RL connected to the data voltage distribution circuit DMUX to the number of the data lines DL connected to the data voltage distribution circuit DMUX may be 1:q, where q is an integer equal to or greater than 2. The data voltage distribution circuit DMUX may distribute a data voltage applied to one routing line RL to a plurality of data lines DL.

The display driver circuit 200 is connected to the display pads DP and receives digital video data and timing signals. The display driver circuit 200 converts the digital video data into analog positive/negative polarity data voltages and supplies the analog positive/negative polarity data voltages to the data lines DL through the routing lines RL and the data voltage distribution circuit DMUX. In addition, the display driver circuit 200 generates the scan control signal for controlling the scan driver circuit SDC and supplies the scan control signal to the scan driver circuit SDC through the scan control line SCL. Pixels P to be supplied with the data voltages are selected by the scan signals of the scan driver circuit SDC, and the data voltages are supplied to the selected pixels P. In addition, the display driver circuit 200 may supply power supply voltages to the power supply lines.

The display driver circuit 200 may be formed as an integrated circuit (IC) and mounted on the display panel 100 in a pad area PDA using a chip-on-glass (COG) method, a chip-on-plastic (COP) method, or an ultrasonic bonding method. However, exemplary embodiments are not limited to this case, and the display driver circuit 200 may also be mounted on the circuit board 300.

The pads DP may be electrically to the display driver circuit 200. The circuit board 300 may be attached onto the pads DP using an anisotropic conductive film. Therefore, lead lines of the circuit board 300 may be electrically connected to the pads DP. The circuit board 300 may be a flexible printed circuit board, a printed circuit board, or a flexible film such as a chip on film.

A pixel P may include a driving transistor DT, at least one switching transistor ST, a light emitting element EL, and a capacitor Cst as shown in FIG. 3.

The switching transistor ST is turned on by a scan signal received from a $k^{th}$ scan line SLk (where k is a positive integer). Therefore, a data voltage of a jth data line DLj (where j is a positive integer) may be applied to a gate electrode of the driving transistor DT. The switching transistor ST may have a gate electrode connected to the kth scan line SLk, a source electrode connected to the gate electrode of the driving transistor DT, and a drain electrode connected to the jth data line DLj.

The driving transistor DT may supply a driving current to the light emitting element EL according to the data voltage applied to the gate electrode, thereby causing the light emitting element EL to emit light. The driving transistor DT may have the gate electrode connected to the drain electrode of the switching transistor ST, a source electrode connected to a first electrode of the light emitting element EL, and a drain electrode connected to a first power supply line VDDL to which a first power supply voltage is applied.

The driving transistor DT and the at least one switching transistor ST may be thin-film transistors. In addition, although the driving transistor DT and the at least one switching transistor ST are formed as N-type semiconductor transistors having N-type semiconductor characteristics in FIG. 3, exemplary embodiments are not limited to this case. That is, the driving transistor DT and the at least one switching transistor ST may also be formed as P-type semiconductor transistors having P-type semiconductor characteristics.

The light emitting element EL may emit light according to the driving current of the driving transistor DT. The light emitting element EL may be an organic light emitting diode including the first electrode, an organic light emitting layer, and a second electrode. The first electrode of the light emitting element EL may be connected to the drain electrode of the driving transistor DT, and the second electrode may be connected to a second power supply line VSSL to which a second power supply voltage lower than the first power supply voltage is applied.

The capacitor Cst may be connected between the gate electrode and the source electrode of the driving transistor DT. Therefore, the capacitor Cst may maintain the data voltage applied to the gate electrode of the driving transistor DT constant.

Figure 4:
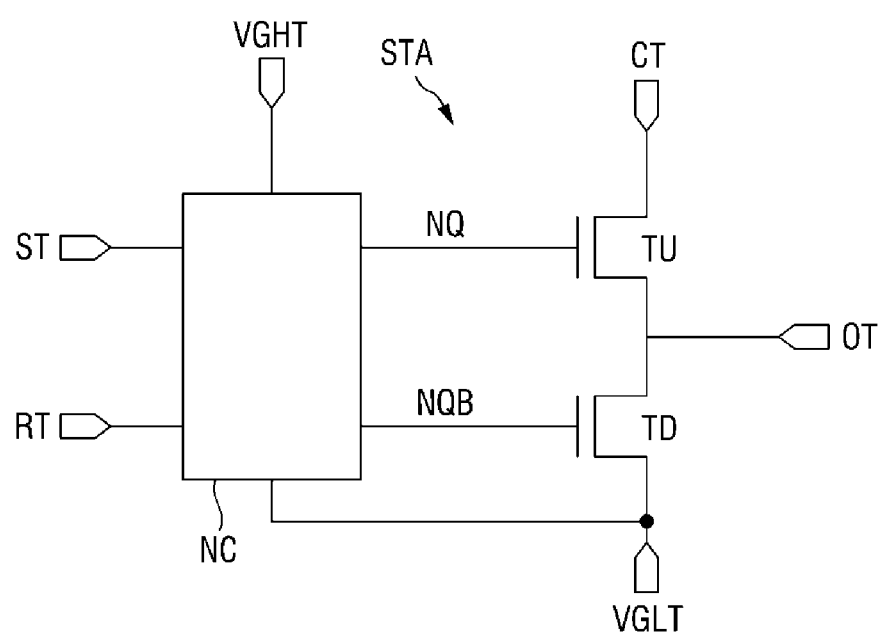
FIG. 4 is a circuit diagram of an exemplary embodiment of a scan driver circuit shown in FIG. 2.

FIG. 4 is a circuit diagram of an exemplary embodiment of the scan driver circuit SDC shown in FIG. 2.

A scan driver circuit SDC may include a plurality of stages STA connected in a dependent manner, and FIG. 4 shows an exemplary embodiment of a single stage STA. The stage STA may sequentially output scan signals to the scan lines SL.

Referring to FIG. 4, each of the stages STA includes a pull-up node NQ, a pull-down node NQB, a pull-up transistor TU which is turned on when the pull-up node NQ has a gate-on voltage, a pull-down transistor TD which is turned on when the pull-down node NQB has a gate-on voltage, and a node controller NC for controlling charging and discharging of the pull-up node NQ and the pull-down node NQB.

The node controller NC may be connected to a start terminal ST to which a start signal or an output signal of a previous stage is input, a reset terminal RT to which an output signal of a next stage is input, a gate-on voltage terminal VGHT to which a gate-on voltage is applied, and a gate-off voltage terminal VGLT to which a gate-off voltage is applied. The node controller NC controls charging and discharging of the pull-up node NQ and the pull-down node NQB according to the start signal or the output signal of the previous stage input to the start terminal ST. In order to stably control an output of a stage STA, the node controller NC controls the pull-down node NQB to have a gate-off voltage when the pull-up node NQ has a gate-on voltage and controls the pull-up node NQ to have a gate-off voltage when the pull-down node NQB has a gate-on voltage. To this end, the node controller NC may include a plurality of transistors.

The pull-up transistor TU is turned on when the stage STA is pulled up, that is, when the pull-up node NQ has a gate-on voltage and outputs a clock signal, which is input to a clock terminal CT, to an output terminal OT. The pull-down transistor TD is turned on when the stage STA is pulled down, for example, when the pull-down node NQB has a gate-on voltage, and outputs a gate-off voltage of the gate-off voltage terminal VGLT to the output terminal OT.

The pull-up transistor TU, the pull-down transistor TD and the transistors of the node controller NC of the stage STA may be formed as thin-film transistors. In addition, although the pull-up transistor TU, the pull-down transistor TD and the transistors of the node controller NC of the stage STA are formed as N-type semiconductor transistors having N-type semiconductor characteristics in FIG. 4, exemplary embodiments are not limited to this case. That is, the pull-up transistor TU, the pull-down transistor TD and the transistors of the node controller NC of the stage STA may also be formed as P-type semiconductor transistors having P-type semiconductor characteristics.

Figure 5:
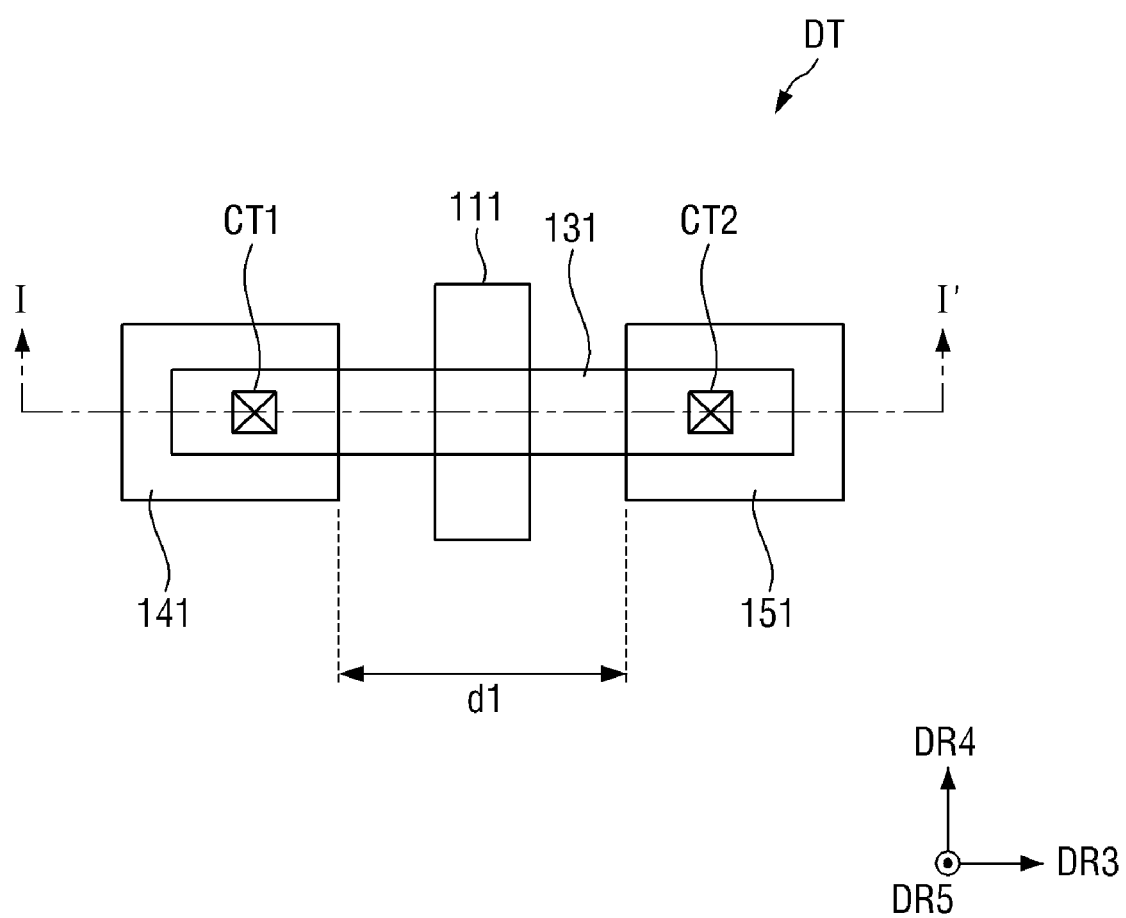
FIG. 5 is a plan view of an exemplary embodiment of a driving transistor of the pixel shown in FIG. 3.
Figure 6:
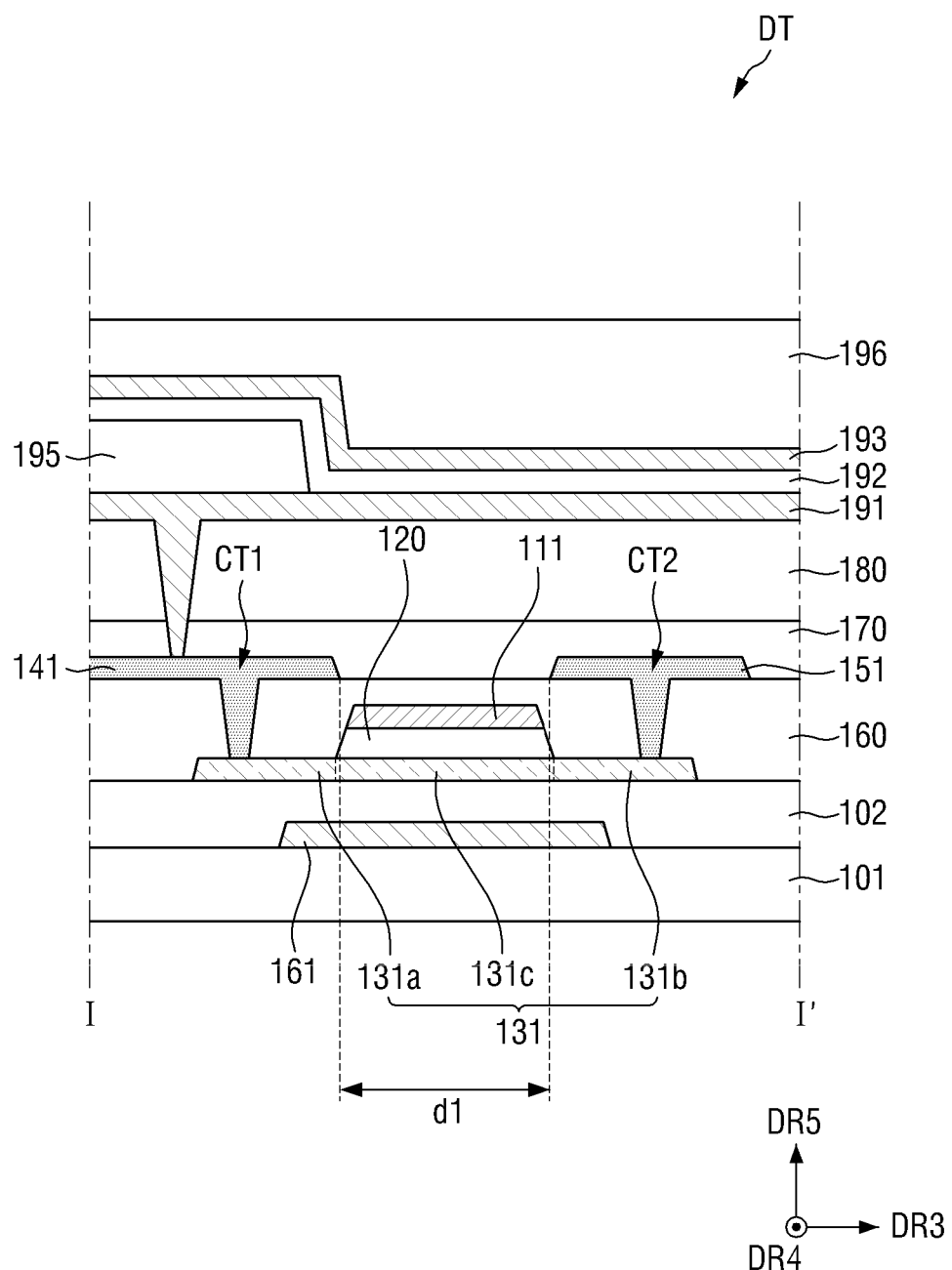
FIG. 6 is a cross-sectional view taken along I-I' of FIG. 5.
Figure 7:
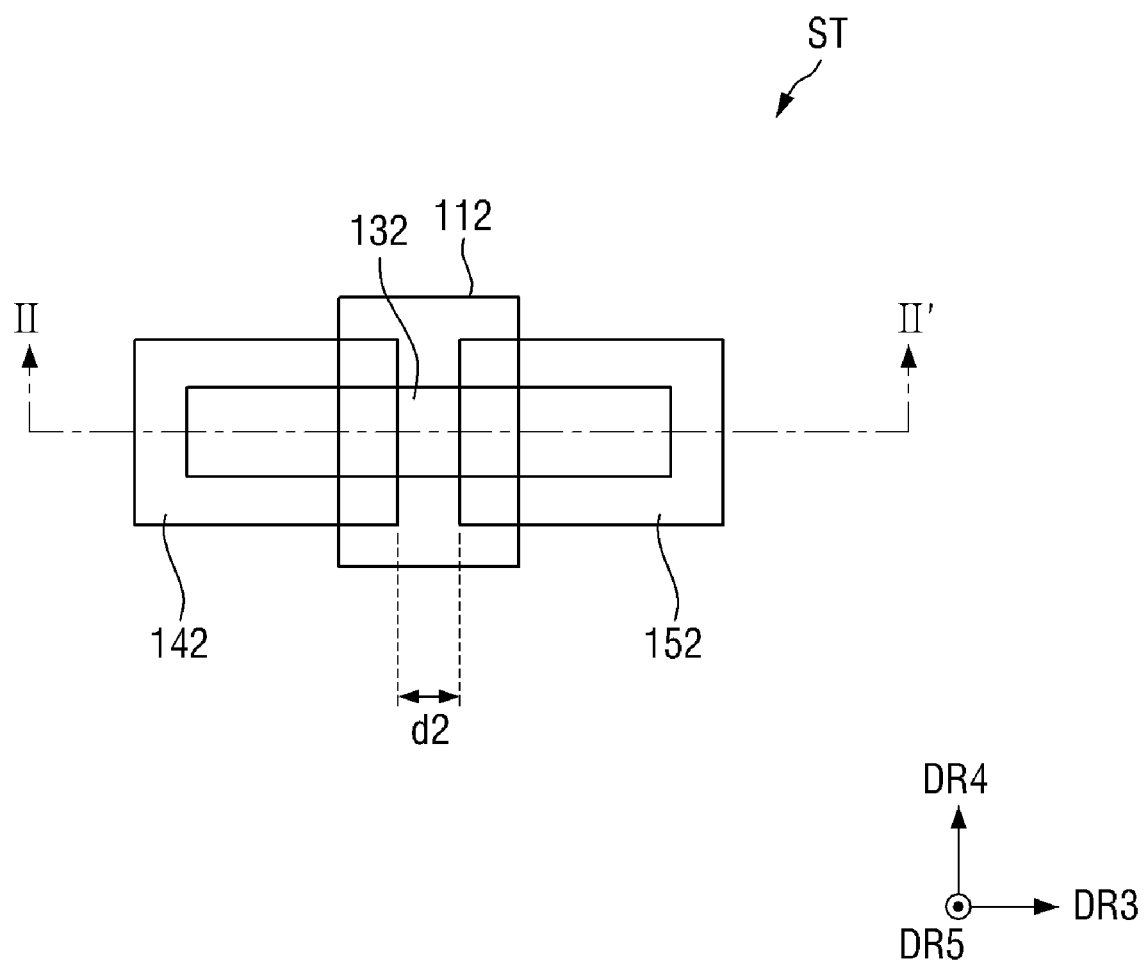
FIG. 7 is a plan view of an exemplary embodiment of a switching transistor of the pixel shown in FIG. 3.
Figure 8:
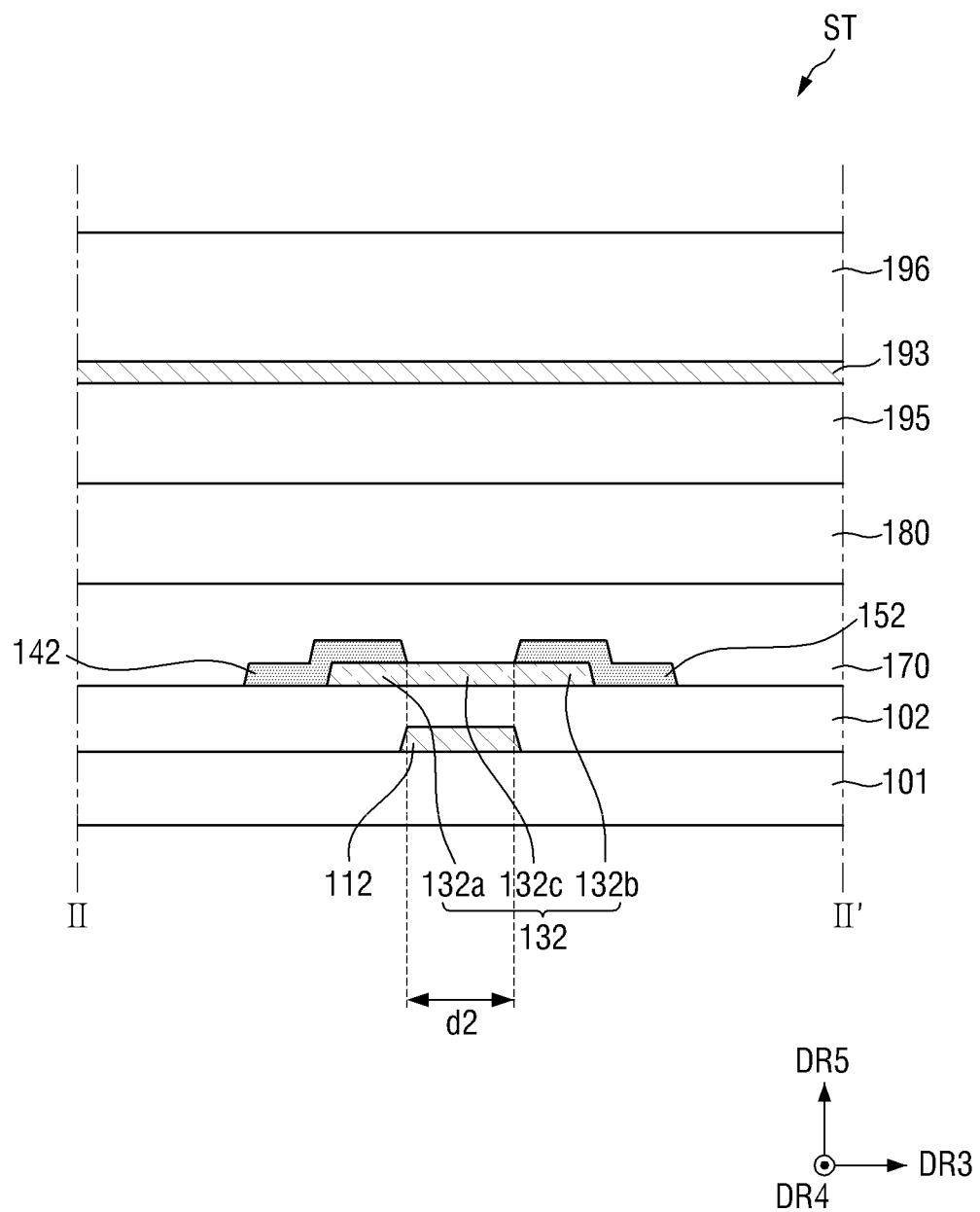
FIG. 8 is a cross-sectional view taken along II-IF of FIG. 7.

FIG. 5 is a plan view of an exemplary embodiment of the driving transistor DT of the pixel P shown in FIG. 3. FIG. 6 is a cross-sectional view taken along I-I' of FIG. 5. FIG. 7 is a plan view of an exemplary embodiment of the switching transistor ST of the pixel P shown in FIG. 3. FIG. 8 is a cross-sectional view taken along II-II' of FIG. 7.

In an exemplary embodiment shown in FIGS. 5 and 6, the driving transistor DT of the pixel P has a top gate structure in which a gate electrode is formed on top of an active layer, and in an exemplary embodiment shown in FIGS. 7 and 8, the switching transistor ST has a bottom gate structure in which a gate electrode is formed underneath the active layer. Specifically, for example, the driving transistor DT may be formed in a coplanar structure, and the switching transistor ST may be formed in a back-channel-etch structure.

Referring to FIGS. 5 through 8, the driving transistor DT as shown in FIGS. 5 and 6 includes a first gate electrode 111, a first active layer 131, a first source electrode 141, a first drain electrode 151, and a first metal layer 161. The switching transistor ST as shown in FIGS. 7 and 8 includes a second gate electrode 112, a second active layer 132, a second source electrode 142, and a second drain electrode 152.

The driving transistor DT and the switching transistor ST are formed on a first substrate 101. The first substrate 101 may be made of plastic or glass.

The first metal layer 161 shown in FIG. 6 and the second electrode 112 shown in FIG. 8 may be formed on the first substrate 101.

The first metal layer 161 may be a layer for blocking light coming from the first substrate 101 from entering the first active layer 131.

The first metal layer 161 and/or the second gate electrode 112 may be a single layer or a multilayer made of any one or more of molybdenum (Mo), aluminum (Al), chromium (Cr), gold (Au), titanium (Ti), nickel (Ni), neodymium (Nd), copper (Cu), and alloys of these materials.

The first metal layer 161 and the second gate electrode 112 may be integrally formed with each other and may be formed from the same material.

The length of the first metal layer 161 in a third direction DR3 may be greater than that of the second gate electrode 112 in the third direction DR3. The length of the first metal layer 161 in the third direction DR3 may be smaller than that of the first active layer 131 in the third direction DR3. In addition, the length of the first metal layer 161 in the third direction DR3 may be greater than that of the first gate electrode 111 in the third direction DR3.

A first insulating layer 102 may be disposed on the first metal layer 161. The first insulating layer 102 may be a layer for protecting the driving transistor DT and the switching transistor ST of the pixel P from moisture being introduced through the first substrate 101. The first insulating layer 102 may be composed of a plurality of inorganic layers stacked alternately. For example, the first insulating layer 102 may be a multilayer in which one or more inorganic layers selected from a silicon oxide (SiOx) layer, a silicon nitride (SiNx) layer, and SiON are alternately stacked.

The first active layer 131 shown in FIG. 6 and the second active layer 132 shown in FIG. 8 may be formed on the first insulating layer 102. The first active layer 131 and the second active layer 132 may directly contact the first insulating layer 102. That is, a surface of the first insulating layer 102 may directly contact the first metal layer 161 of FIG. 6 and the second gate electrode 112 of FIG. 8, and the other surface of the first insulating layer 102 may directly contact the first active layer 131 of FIG. 6 and the second active layer 132 of FIG. 8.

The first active layer 131 and the second active layer 132 may include source regions 131a and 132a, drain regions 131b and 132b, and channel regions 131c and 132c, respectively. The channel regions 131c and 132c may be disposed between the source regions 131a and 132a and the drain regions 131b and 132b.

The first active layer 131 and the second active layer 132 may be oxide semiconductors. The first active layer 131 and the second active layer 132 may be made of indium-gallium-zinc oxide or indium-tin-zinc oxide.

The length of the first active layer 131 in the third direction DR3 may be greater than that of the second active layer 132 in the third direction DR3.

The first active layer 131 may overlap the first gate electrode 111 with a first gate insulating layer 120 interposed between them as shown in FIG. 6. The second active layer 132 may overlap the second gate electrode 112 with the first insulating layer 102 interposed between them as shown in FIG. 8. Specifically, the channel region 131c of the first active layer 131 may overlap the first gate electrode 111, and the second channel region 132c of the second active layer 132 may overlap the second gate electrode 112.

Referring to FIG. 6, the first gate insulating layer 120 is disposed on the first active layer 131. The first gate insulating layer 120 may be an inorganic layer, for example, a silicon oxide (SiOx) layer, a silicon nitride (SiNx) layer, or a multilayer composed of these layers. In addition, referring to FIG. 8, the second source electrode 142 and the second drain electrode 152 may be disposed on the second active layer 132 and a first protective layer 170 may be formed on the second source electrode 142 and the second drain electrode 152, such that the first gate insulating layer 120 may not be disposed on the second active layer 132. That is, the second active layer 132 may not overlap the first gate insulating layer 120 and may not contact the first gate insulating layer 120.

Referring to FIG. 6, the first gate electrode 111 is disposed on the first gate insulating layer 120. The first gate electrode 111 may be a single layer or a multilayer made of any one or more of molybdenum (Mo), aluminum (Al), chromium (Cr), gold (Au), titanium (Ti), nickel (Ni), neodymium (Nd), copper (Cu), and alloys of these materials.

Although the first gate insulating layer 120 is disposed only between the first gate electrode 111 and the first active layer 131 in FIG. 6, exemplary embodiments are not limited to this case. That is, the first gate insulating layer 120 may also be formed on upper and side surfaces of the first active layer 131.

Figure 9:
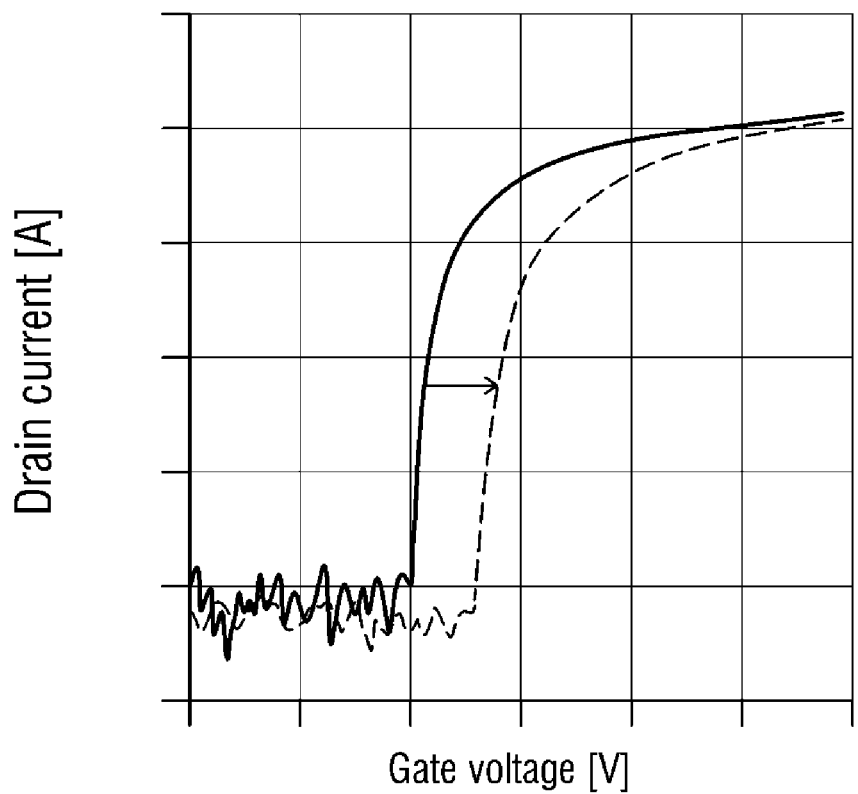
FIG. 9 is a graph of driving current versus gate voltage of a bottom gate transistor.
Figure 10:
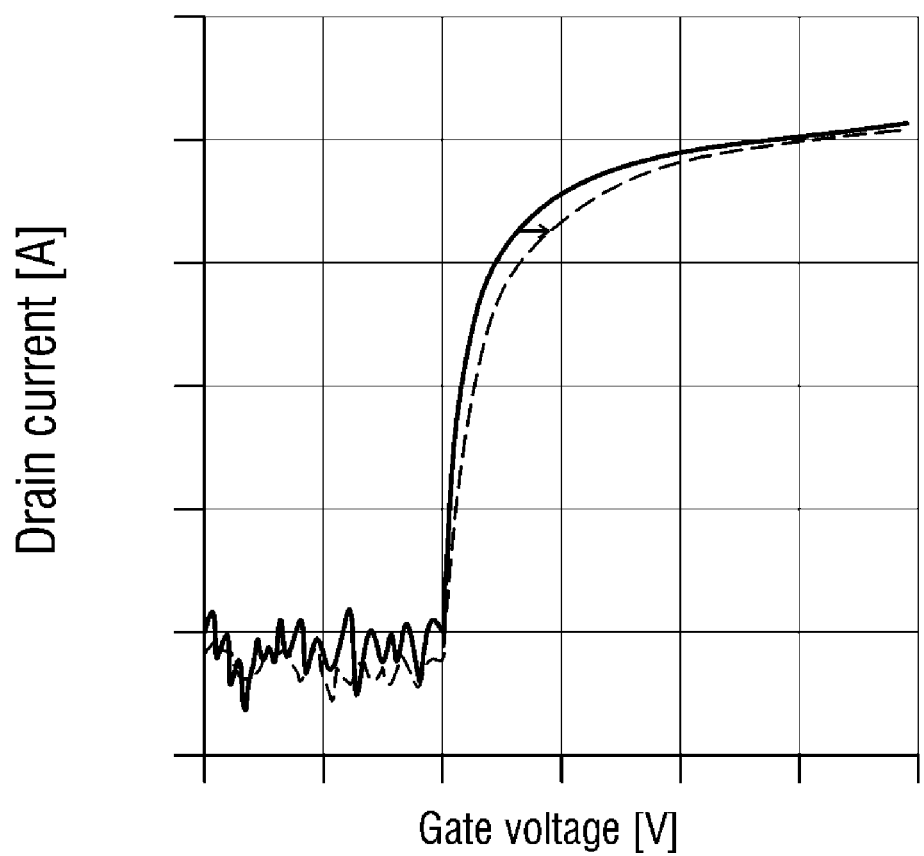
FIG. 10 is a graph of driving current versus gate voltage of a top gate transistor.

FIG. 9 is a graph of driving current versus gate voltage of a bottom gate transistor. FIG. 10 is a graph of driving current versus gate voltage of a top gate transistor.

FIGS. 9 and 10 are graphs illustrating the result of the positive bias stress. Referring to FIGS. 9 and 10, the driving transistor DT exhibits excellent reliability against positive bias stress when formed in the top gate structure, that is, when formed as a top gate transistor as shown in FIG. 10 as compared with when formed as a bottom gate transistor as shown in FIG. 9. Therefore, the reliability of the driving transistor DT can be ensured.

Referring to FIG. 6 again, a second insulating layer 160 is disposed on the first gate electrode 111. The second gate insulating layer 160 may be an inorganic layer, for example, a silicon oxide (SiOx) layer, a silicon nitride (SiNx) layer, or a multilayer composed of these layers.

The second gate insulating layer 160 may directly contact upper and side surfaces of the first gate electrode 111 and side surfaces of the first gate insulating layer 120.

In addition, the second gate insulating layer 160 may overlap the first active layer 131 and directly contact the first active layer 131. In addition, the second insulating layer 160 may not be disposed on the second active layer 132. That is, the second insulating layer 160 may not overlap the second active layer 132 and may not contact the second active layer 132.

A first contact hole CT1 passing through the second insulating layer 160 to expose a portion of the upper surface of the first active layer 131 and a second contact hole CT2 passing through the second insulating layer 160 to expose another portion of the upper surface of the first active layer 131 may be formed in the second insulating layer 160. That is, the first contact hole CT1 may expose the first source region 131a of the first active layer 131, and the second contact hole CT2 may expose the first drain region 131b of the first active layer 131.

The first source electrode 141 and the first drain electrode 151 of the driving transistor DT may be disposed on the second insulating layer 160 as shown in FIG. 6. The second source electrode 142 and the second drain electrode 152 of the switching transistor ST may be disposed on the second active layer 132 as shown in FIG. 8.

Referring to FIG. 6, the first source electrode 141 contacts the first source region 131a formed on a side of the first active layer 131 through the first contact hole CT1. The first drain electrode 151 contacts the first drain region 131b formed on the other side of the first active layer 131 through the second contact hole CT2.

Referring to FIG. 8, the second source electrode 142 may contact the second source region 132a formed on a side of the second active layer 132. The second drain electrode 152 may contact the second drain region 132b formed on the other side of the second active layer 132.

Each of the first source electrode 141, the second source electrode 142, the first drain electrode 151 and the second drain electrode 152 may be a single layer or a multilayer made of any one or more of zinc indium oxide (ZIO), molybdenum (Mo), aluminum (Al), chromium (Cr), gold (Au), titanium (Ti), nickel (Ni), neodymium (Nd), copper (Cu), and alloys of these materials. For example, each of the first source electrode 141, the second source electrode 142, the first drain electrode 151 and the second drain electrode 152 may be a stacked structure of ZIO—Cu—ZIO.

A first distance d1 between the first source electrode 141 and the first drain electrode 151 in the third direction DR3 shown in FIGS. 5 and 6 may be greater than a second distance d2 between the second source electrode 142 and the second drain electrode 152 in the third direction DR3 shown in FIGS. 7 and 8.

That is, as shown in FIG. 8, since the second source electrode 142 and the second drain electrode 152 can directly contact the second active layer 132 without a layer interposed between them in the switching transistor ST, the second distance d2 between the second source electrode 142 and the second drain electrode 152 in the third direction DR3 can be reduced less than the first first distance d1 between the first source electrode 141 and the first drain electrode 151 in the third direction DR3 shown in FIG. 6. Accordingly, the area of the switching transistor ST in the pixel P can be reduced, thus making it possible to increase the number of pixels in a given area and easily realize a high-resolution display device.

The first protective layer 170 is formed on the first source electrode 141, the second source electrode 142, the first-drain electrode 151 and the second drain electrode 152. The first protective layer 170 may be an inorganic layer, for example, a silicon oxide (SiOx) layer, a silicon nitride (SiNx) layer, or a multilayer composed of these layers.

A first planarization layer 180 may be formed on the first protective layer 170 to flatten steps due to thin-film transistors such as the driving transistor DT and the switching transistor ST. The first planarization layer 180 may be made of an organic layer such as acryl resin, epoxy resin, phenolic resin, polyamide resin, or polyimide resin.

A light emitting element EL, which includes a first electrode 191, an organic light emitting layer 192 and a second electrode 193, and a pixel defining layer 195 may be formed on the first planarization layer 180 as shown in FIG. 6.

Referring to FIGS. 6 and 8, the first electrode 191 may be formed on the first planarization layer 180. The first electrode 191 may be connected to the first source electrode 141 of the driving transistor DT through a contact hole passing through the first protective layer 170 and the first planarization layer 180.

The pixel defining layer 195 may be formed on the first planarization layer 180 and may cover edges of the first electrode 191 to define pixels. That is, the pixel defining layer 195 serves as a pixel defining layer for defining pixels. Here, each of the pixels is an area in which the first electrode 191, the organic light emitting layer 192 and the second electrode 193 are sequentially stacked so that holes from the first electrode 191 and electrons from the second electrode 193 combine together in the organic light emitting layer 192 to emit light.

The organic light emitting layer 192 may be disposed on the first electrode 191 and the pixel defining layer 195. The organic light emitting layer 192 may include a hole transporting layer, a light emitting layer, and an electron transporting layer. In addition, the organic light emitting layer 192 may be formed in a tandem structure of two stacks or more, in which case a charge generating layer may be formed between the stacks.

The second electrode 193 may be formed on the organic light emitting layer 192. The second electrode 193 may be a common layer common to all pixels.

The light emitting element EL may be of a top emission type which emits light toward a second substrate, that is, in an upward direction. In this case, the first electrode 191 may be made of a metal material having high reflectivity, such as a stack (Ti/Al/Ti) of aluminum (Al) and titanium (Ti), a stack (ITO/Al/ITO) of aluminum (Al) and indium tin oxide (ITO), an APC alloy, or a stack (ITO/APC/ITO) of an APC alloy and ITO. The APC alloy is an alloy of silver (Ag), palladium (Pd), and copper (Cu). In addition, the second electrode 193 may be made of a transparent conductive material (TCO) capable of transmitting light such as ITO or indium zinc oxide (IZO) or may be made of a semi-transmissive conductive material such as magnesium (Mg), silver (Ag) or an alloy of magnesium (Mg) and silver (Ag). When the second electrode 193 is made of a semi-transmissive conductive material, the light emission efficiency may be increased by micro-cavities.

An encapsulation layer 196 may be formed on the second electrode 193 to prevent introduction of oxygen or moisture. The encapsulation layer 196 may include at least one inorganic layer. The inorganic layer may be made of silicon nitride, aluminum nitride, zirconium nitride, titanium nitride, hafnium nitride, tantalum nitride, silicon oxide, aluminum oxide, or titanium oxide. In addition, the encapsulation layer 196 may include at least one organic layer to prevent particles from penetrating the encapsulation layer 196 and entering the organic light emitting layer 192 and the second electrode 193. The organic layer may be made of epoxy, acrylate, or urethane acrylate.

According to the exemplary embodiment of FIGS. 5 through 8, the driving transistor DT shown in FIGS. 5 and 6 has the top gate structure, and the switching transistor ST shown in FIGS. 7 and 8 has the bottom gate structure. Therefore, it is possible to ensure the reliability of the display device while reducing the area of the switching transistor ST, thus realizing a high-resolution display device.

Further, the first active layer 131 of the driving transistor DT shown in FIGS. 5 and 6 and the second active layer 132 of the switching transistor ST shown in FIGS. 5 and 6 are disposed on the same layer, the first active layer 131 and the second active layer 132 can be formed at the same time through the same mask processing step. Therefore, the number of masks can be maintained during the manufacturing process of display device, and thus ensuring process economics.

The pull-up transistor TU, the pull-down transistor TD and the transistors of the node controller NC shown in FIG. 4 of the scan driver circuit SDC shown in FIG. 2 may each include a third gate electrode, a third active layer, a third source electrode, and a third drain electrode. Each of the pull-up transistor TU, the pull-down transistor TD and the transistors of the node controller NC of the scan driver circuit SDC may have substantially the same bottom gate structure as the switching transistor ST shown in FIGS. 7 and 8. In this case, the third gate electrode, the third active layer, the third source electrode and the third drain electrode of each of the pull-up transistor TU, the pull-down transistor TD and the transistors of the node controller NC of the scan driver circuit SDC are substantially the same as the second gate electrode 112, the second active layer 132, the second source electrode 142 and the second drain electrode 152 of the switching transistor ST described above with reference to FIGS. 7 and 8, and thus a detailed description thereof is omitted to avoid redundancy.

Since the transistors of the scan driver circuit SDC are formed to have the same bottom gate structure as the switching transistor ST, the distance between the second source electrode 142 and the second drain electrode 152 of each of the transistors can be reduced as explained above. Therefore an increase in the width of the scan driver circuit SDC can be prevented even if a high-resolution display device is realized.

Hereinafter, other exemplary embodiments will be described. In the following exemplary embodiments, elements identical to those described above will be indicated by the same reference numerals, and a redundant description thereof will be omitted to avoid redundancy or given briefly.

Figure 11:
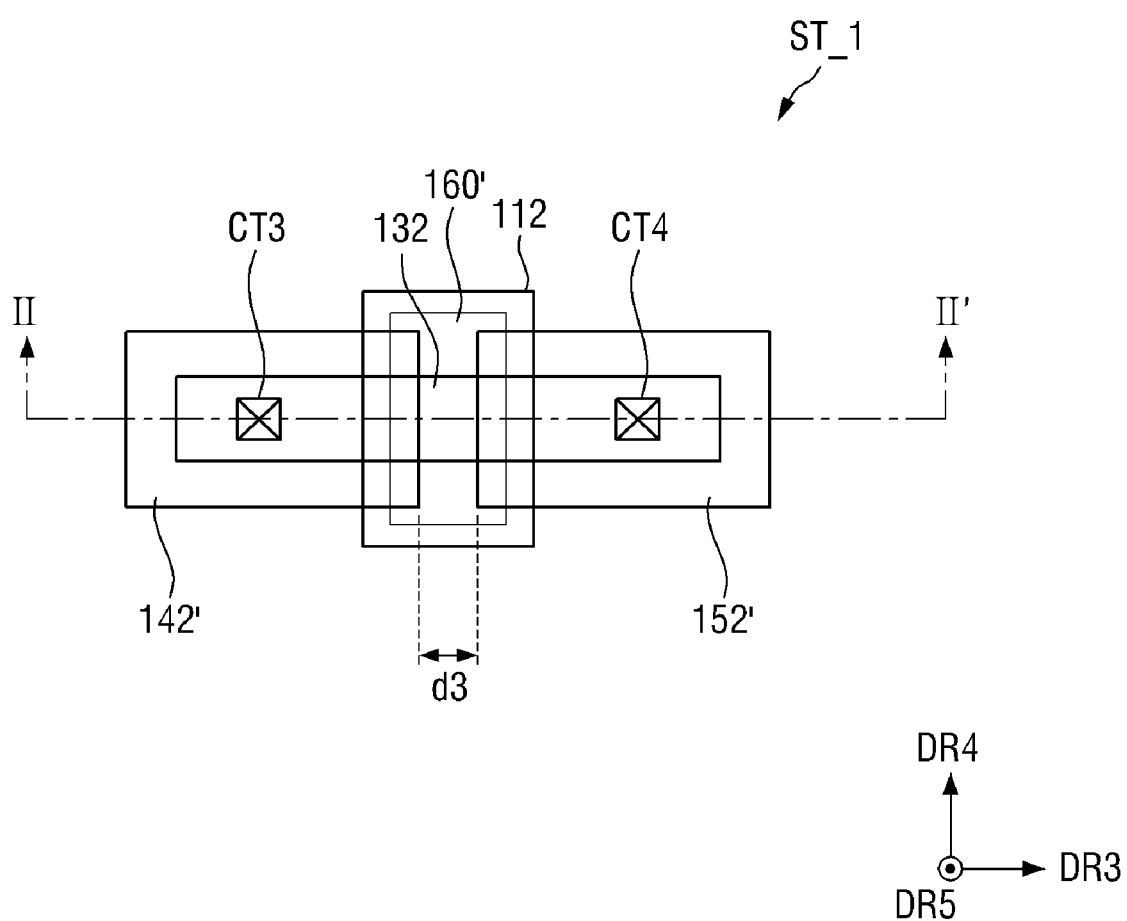
FIG. 11 is a plan view of another exemplary embodiment of the switching transistor of the pixel shown in FIG. 3.
Figure 12:
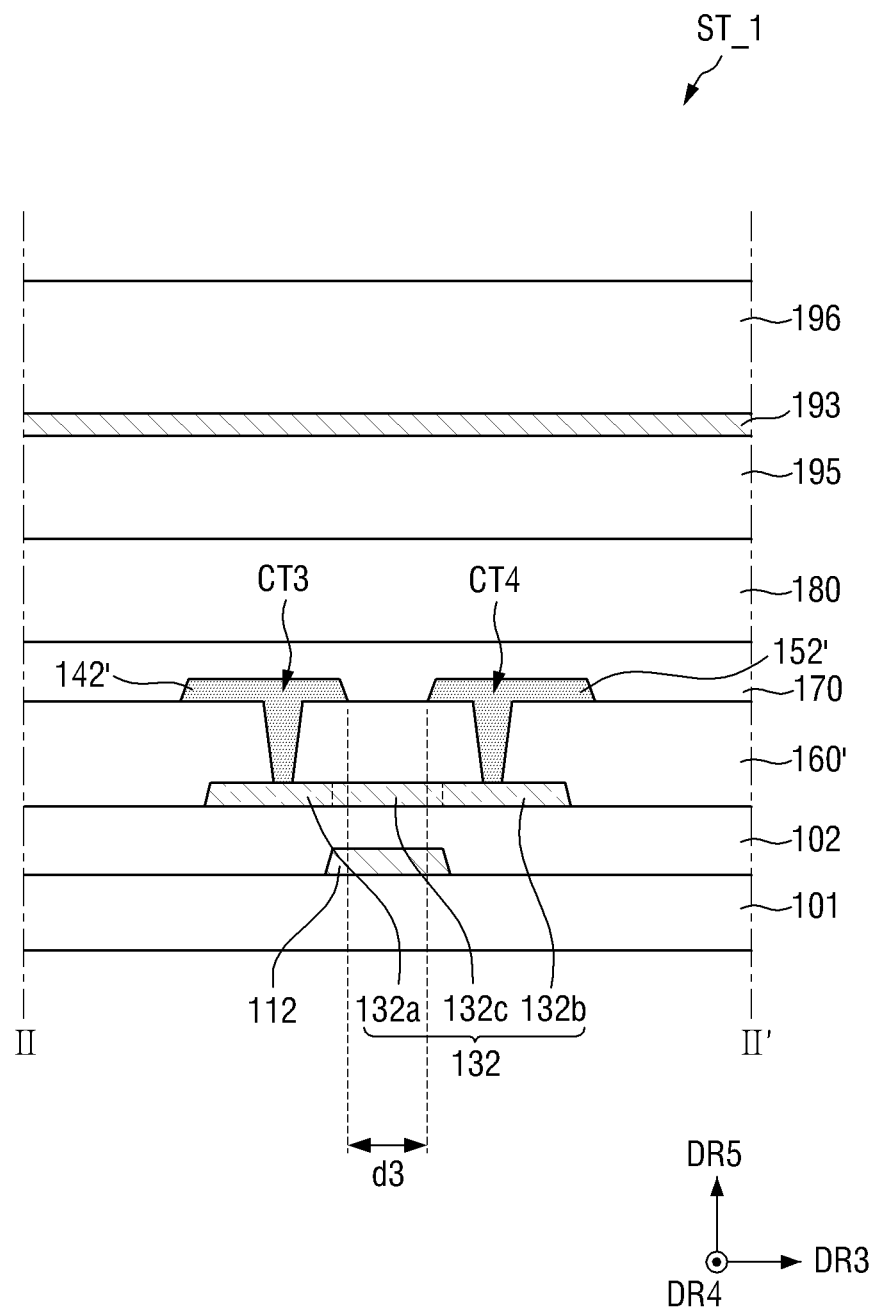
FIG. 12 is a cross-sectional view taken along II-IF of FIG. 11.

FIG. 11 is a plan view of another exemplary embodiment of the switching transistor ST of the pixel P shown in FIG. 3. FIG. 12 is a cross-sectional view taken along II-II' of FIG. 11.

The exemplary embodiment of FIGS. 11 and 12 is different from the exemplary embodiment of FIGS. 7 and 8 in that a switching transistor ST_1 is formed in an etch-stopper structure.

Referring to FIGS. 11 and 12, in the switching transistor ST_1, a second insulating layer 160' is disposed on a second active layer 132. That is, the second insulating layer 160' may overlap the second active layer 132 and directly contact the second active layer 132. The second insulating layer 160' overlapping a second channel region 132c of the second active layer 132 may be an etch-stopper layer.

A third contact hole CT3 passing through the second insulating layer 160' to expose a portion of an upper surface of the second active layer 132 and a fourth contact hole CT4 passing through the second insulating layer 160' to expose another portion of the upper surface of the second active layer 132 may be formed in the second insulating layer 160'. That is, the third contact hole CT3 may expose a second source region 132a of the second active layer 132, and the fourth contact hole CT4 may expose a second drain region 132b of the second active layer 132.

A second source electrode 142' and a second drain electrode 152' of the switching transistor ST_1 may be disposed on the second insulating layer 160'. The second source electrode 142' contacts the second source region 132a formed on a side of the second active layer 132 through the third contact hole CT3. The second drain electrode 152' contacts the second drain region 132b formed on the other side of the second active layer 132 through the fourth contact hole CT4.

Accordingly, the first distance d1 between a first source electrode 141 and a first drain electrode 151 in the third direction DR3 of the driving transistor as shown in FIG. 6 may be greater than a third distance d3 between the second source electrode 142' and the second drain electrode 152' in the third direction DR3 shown in FIGS. 11 and 12. That is, since the switching transistor ST_1 according to the illustrated exemplary embodiment has the bottom gate structure, the third distance d3 between the second source electrode 142' and the second drain electrode 152' in the third direction DR3 can be reduced. Accordingly, the area of the switching transistor ST_1 in a pixel can be reduced, thus making it possible to increase the number of pixels in a given area and easily realize a high-resolution display device.

In addition, since a first active layer 131 of a driving transistor DT and the second active layer 132 of the switching transistor ST_1 are disposed on the same layer, the number of masks can be maintained as described above.

Further, each of a pull-up transistor TU, a pull-down transistor TD and transistors of a node controller NC shown in FIG. 4 of a scan driver circuit SDC shown in FIG. 2 may have substantially the same etch-stopper structure as the switching transistor ST_1 shown in FIGS. 11 and 12. In this case, a third gate electrode, a third active layer, a third source electrode and a third drain electrode of each of the pull-up transistor TU, the pull-down transistor TD and the transistors of the node controller NC of the scan driver circuit SDC are substantially the same as a second gate electrode 112, the second active layer 132, the second source electrode 142 and the second drain electrode 152 of the switching transistor ST_1 described above with reference to FIGS. 11 and 12, and thus a detailed description thereof is omitted to avoid redundancy.

Figure 13:
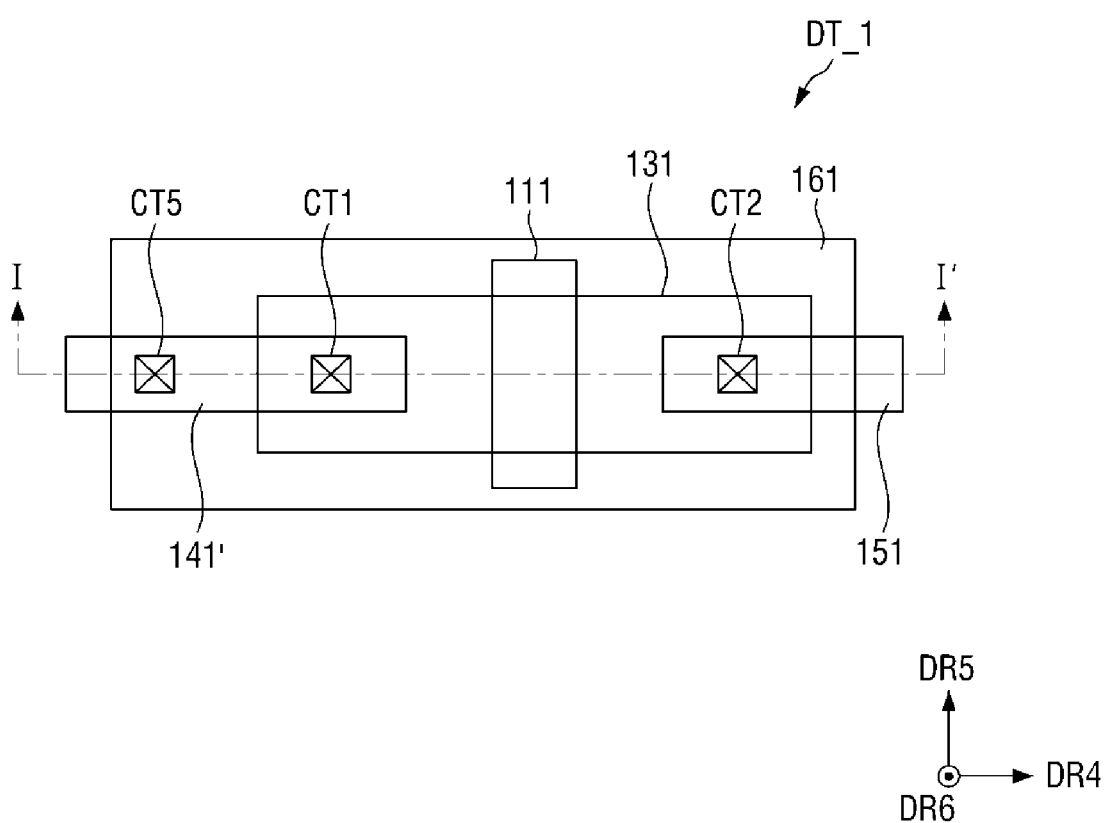
FIG. 13 is a plan view of another exemplary embodiment of the driving transistor of the pixel shown in FIG. 3.
Figure 14:
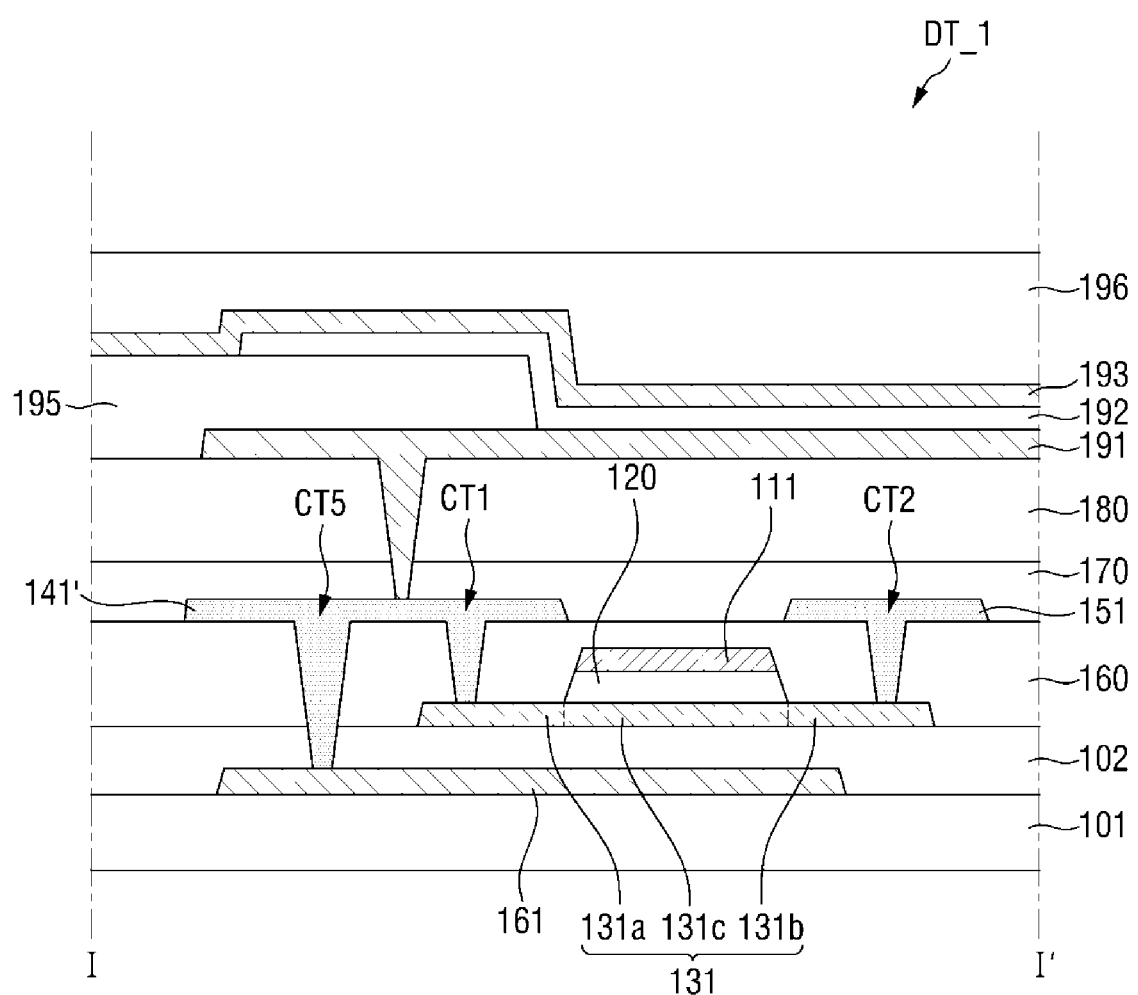
FIG. 14 is a cross-sectional view taken along I-I' of FIG. 13.

FIG. 13 is a plan view of another exemplary embodiment of the driving transistor DT of the pixel P shown in FIG. 3. FIG. 14 is a cross-sectional view taken along I-I' of FIG. 13.

The exemplary embodiment of FIGS. 13 and 14 is different from the exemplary embodiment of FIGS. 5 and 6 in that a first source electrode 141' of a driving transistor DT_1 is connected to a first metal layer 161.

Referring to FIGS. 13 and 14, a fifth contact hole CT5 passing through a first insulating layer 102 and a second insulating layer 160 to expose the first metal layer 161 may be formed in the first insulating layer 102 and the second insulating layer 160.

The first source electrode 141' may contact the first metal layer 161 through the fifth contact hole CT5. In this case, the first metal layer 161 disposed under a first active layer 131 and the first source electrode 141' have the same voltage. When the first metal layer 161 and the first source electrode 141' have the same electric potential, the first active layer 131 adjacent to the first metal layer 161 may not be activated as compared with the first active layer 131 adjacent to a first gate electrode 111. That is, the electron mobility in a channel region 131c of the first active layer 131 may be reduced. Therefore, even if the driving current of each pixel is reduced as the number of pixels increases in a high-resolution display device, a reduction in the driving voltage range of the driving transistor DT_1 can be prevented or reduced.

Figure 15:
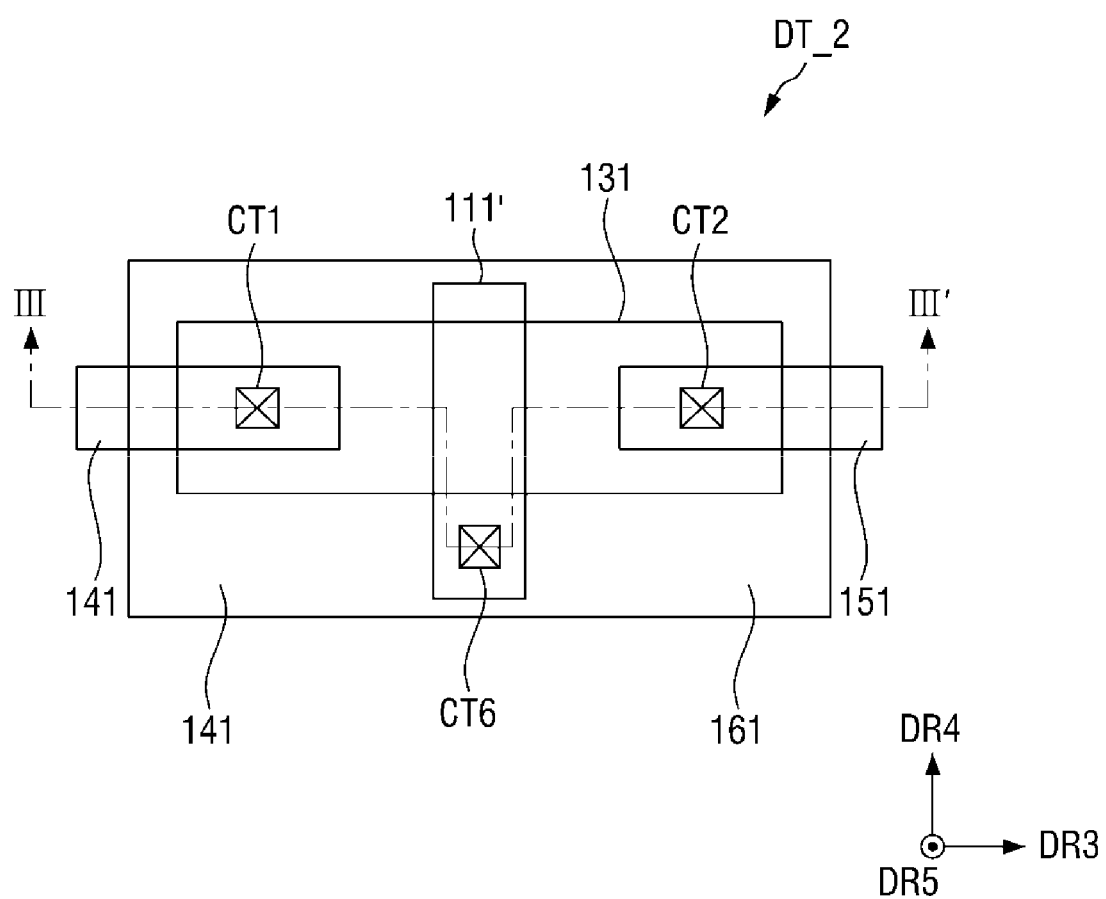
FIG. 15 is a plan view of still another exemplary embodiment of the driving transistor of the pixel shown in FIG. 3.
Figure 16:
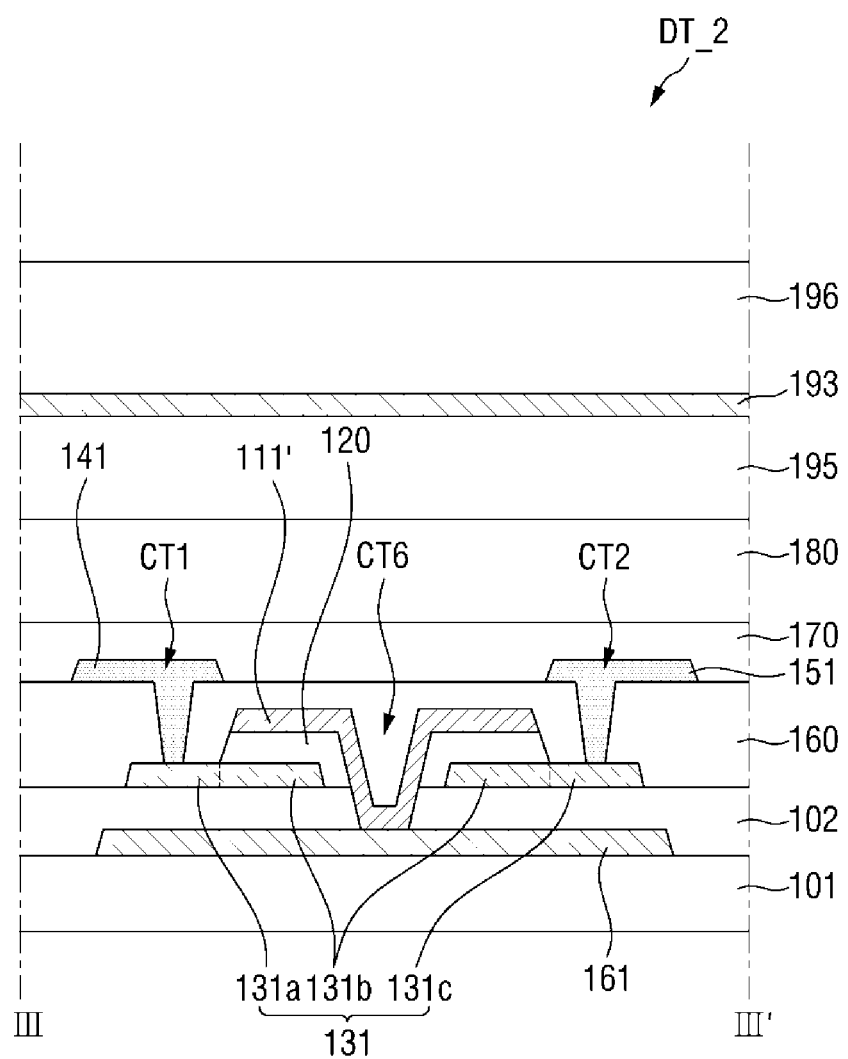
FIG. 16 is a cross-sectional view taken along of FIG. 15.

FIG. 15 is a plan view of still another exemplary embodiment of the driving transistor DT of the pixel P shown in FIG. 3. FIG. 16 is a cross-sectional view taken along III-III' of FIG. 15.

The exemplary embodiment of FIGS. 15 and 16 is different from the exemplary embodiment of FIGS. 5 and 6 in that a first gate electrode 111' of a driving transistor DT_2 is connected to a first metal layer 161.

Referring to FIGS. 15 and 16, a sixth contact hole CT6 passing through a first insulating layer 102 and a first gate insulating layer 120 to expose the first metal layer 161 may be formed in the first insulating layer 102 and the first gate insulating layer 120.

The first gate electrode 111' may contact the first metal layer 161 through the sixth contact hole CT6.

In this case, the first metal layer 161 disposed under a first active layer 131 and the first gate electrode 111' have the same voltage. That is, the first gate electrode 111' may serve as a top gate electrode, and the first metal layer 161 may serve as a bottom gate electrode. Therefore, since the driving transistor DT_2 can be driven in a double-gate manner, it is possible to prevent or reduce the flowing of a leakage current through a channel region 131c of the first active layer 131 when the driving transistor DT_2 is turned off.

Next, a method of manufacturing a display device according to an exemplary embodiment will be described. A method of manufacturing the display device 10 of FIGS. 1 through 8 among display devices according to various exemplary embodiments will be described as an example. Elements substantially identical to those of FIGS. 1 through 8 will be indicated by the same reference numerals, and a detailed description thereof will be omitted to avoid redundancy.

Figure 17:
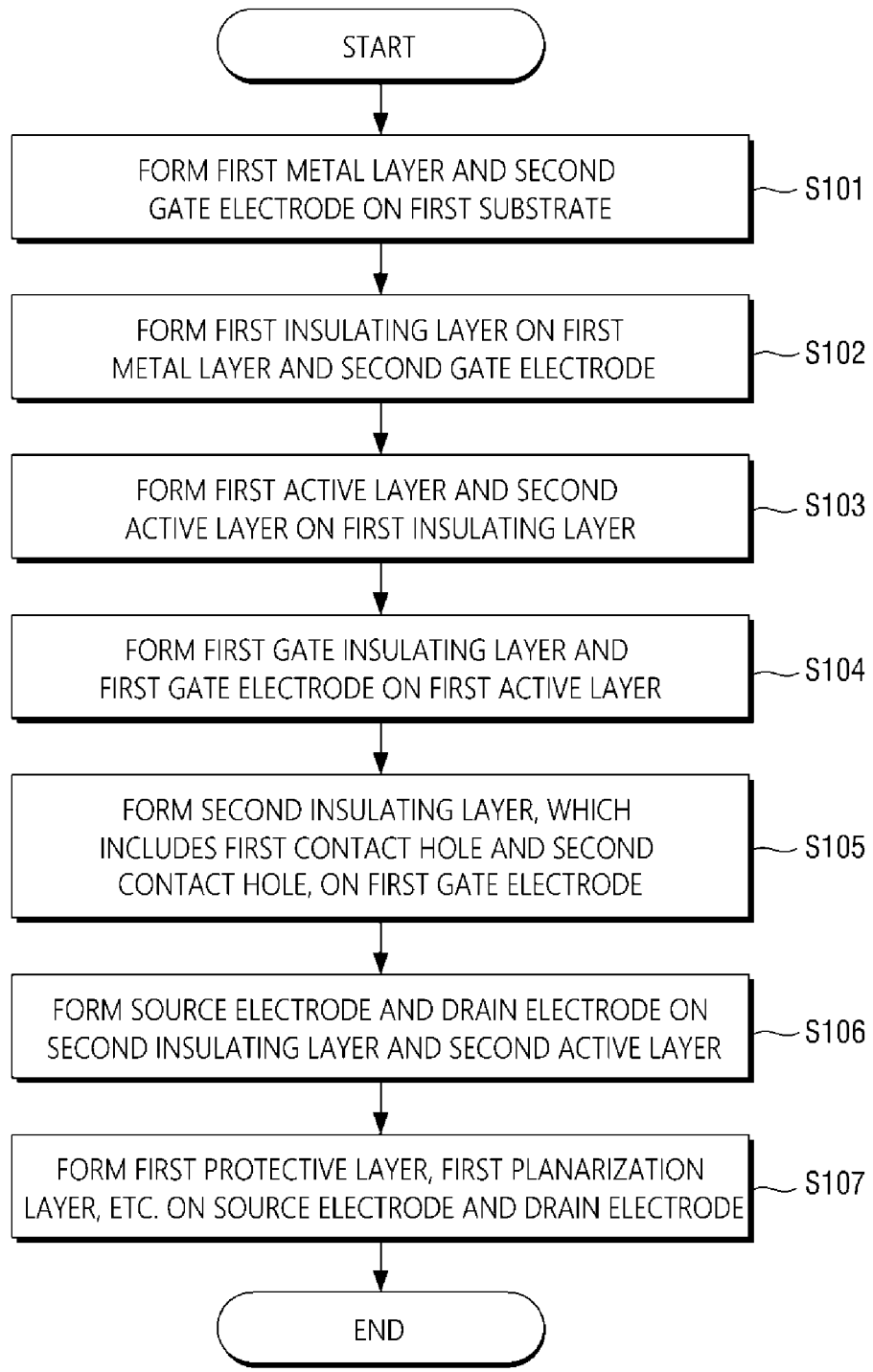
FIG. 17 is a flowchart illustrating an exemplary embodiment of a method of manufacturing a display device according to the principles of the invention.

FIG. 17 is a flowchart illustrating an exemplary embodiment of a method of manufacturing a display device according to the principles of the invention. FIGS. 18 through 24 are cross-sectional views illustrating the steps of the method of manufacturing a display device of FIG. 17. Each of FIGS. 18 through 24 includes a cross section of I-I' shown in FIG. 6 and a cross section of II-II' shown in FIG. 8.

Referring to FIG. 17, the method of manufacturing a display device according to the exemplary embodiment may include forming a first metal layer and a second gate electrode on a first substrate (step S101), forming a first insulating layer on the first metal layer and the second gate electrode (step S102), forming a first active layer and a second active layer on the first insulating layer (step S103), forming a first gate insulating layer and a first gate electrode on the first active layer (step S104), forming a second insulating layer, which includes a first contact hole and a second contact hole, on the first gate electrode (step S105), forming a source electrode and a drain electrode on the second insulating layer and the second active layer (step S106), and forming a first protective layer, a first planarization layer, etc. on the source electrode and the drain electrode (step S107).

Figure 18:
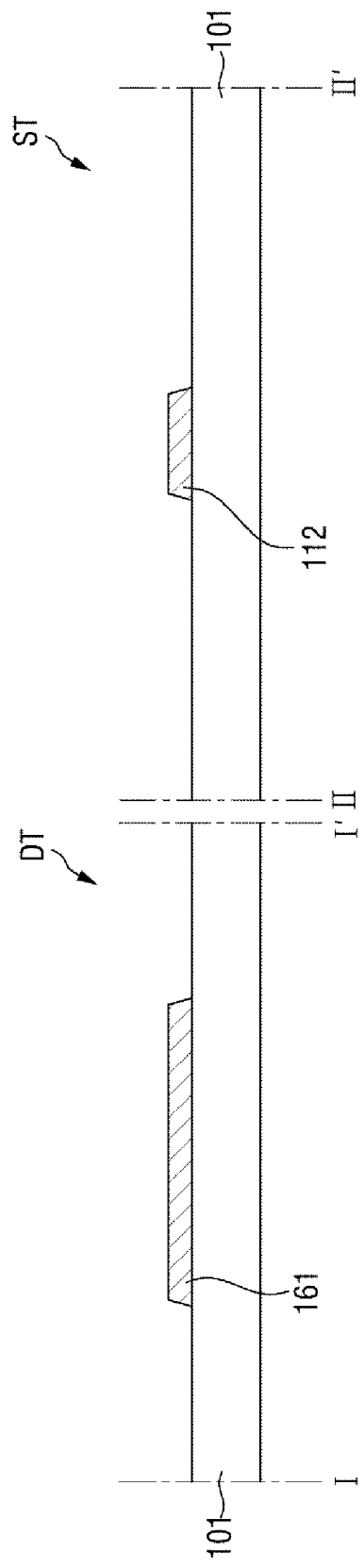
FIGS. 18 through 24 are cross-sectional views illustrating the steps in the method of manufacturing a display device of FIG. 17.

Referring to FIGS. 17 and 18, a first metal layer 161 and a second gate electrode 112 are formed on a first substrate 101 (step S101) in the method of manufacturing a display device according to the exemplary embodiment.

The first metal layer 161 may be a layer for blocking light coming from the first substrate 101 from entering a first active layer 131.

The first metal layer 161 and the second gate electrode 112 may be integrally formed with each other and may be formed from the same material. For example, each of the first metal layer 161 and the second gate electrode 112 may be a single layer or a multilayer made of any one or more of molybdenum (Mo), aluminum (Al), chromium (Cr), gold (Au), titanium (Ti), nickel (Ni), neodymium (Nd), copper (Cu), and alloys of these materials.

The first metal layer 161 and the second gate electrode 112 may be formed by patterning a metal layer, which is formed on the entire surface of the first substrate 101 by sputtering, in an etching process using a photoresist pattern.

Figure 19:
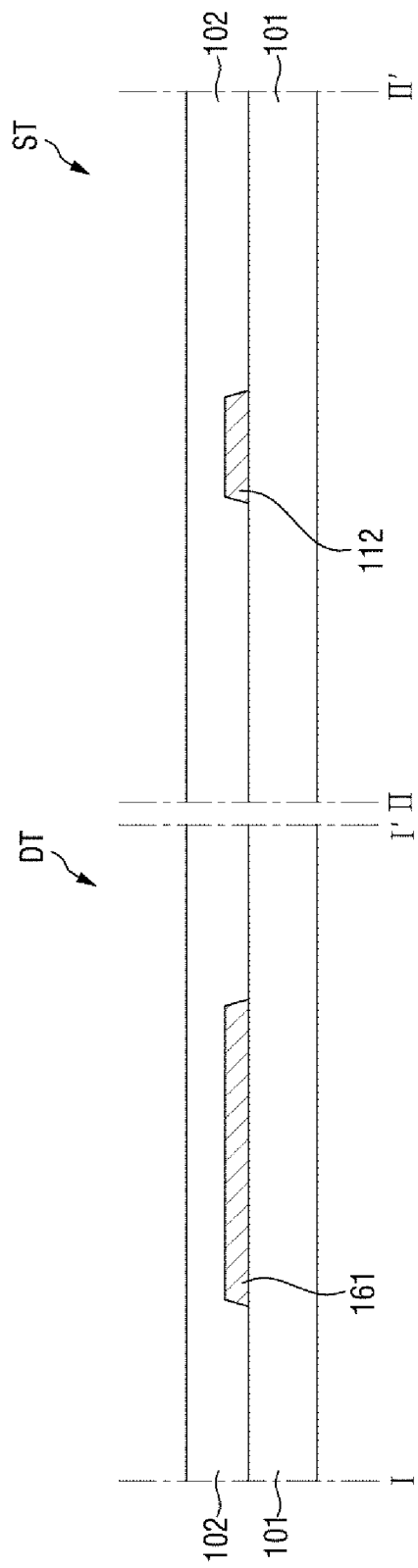

Next, referring to FIGS. 17 and 19, a first insulating layer 102 is formed on top of the first metal layer 161 and the second gate electrode 112 (step S102). The first insulating layer 102 is a layer for protecting a driving transistor DT and a switching transistor ST of each pixel P from moisture being introduced through the first substrate 101. The first insulating layer 102 may be composed of a plurality of inorganic layers stacked alternately. For example, the first insulating layer 102 may be a multilayer in which one or more inorganic layers selected from a silicon oxide (SiOx) layer, a silicon nitride (SiNx) layer, and SiON are alternately stacked. The first insulating layer 102 may be formed by chemical vapor deposition.

Figure 20:
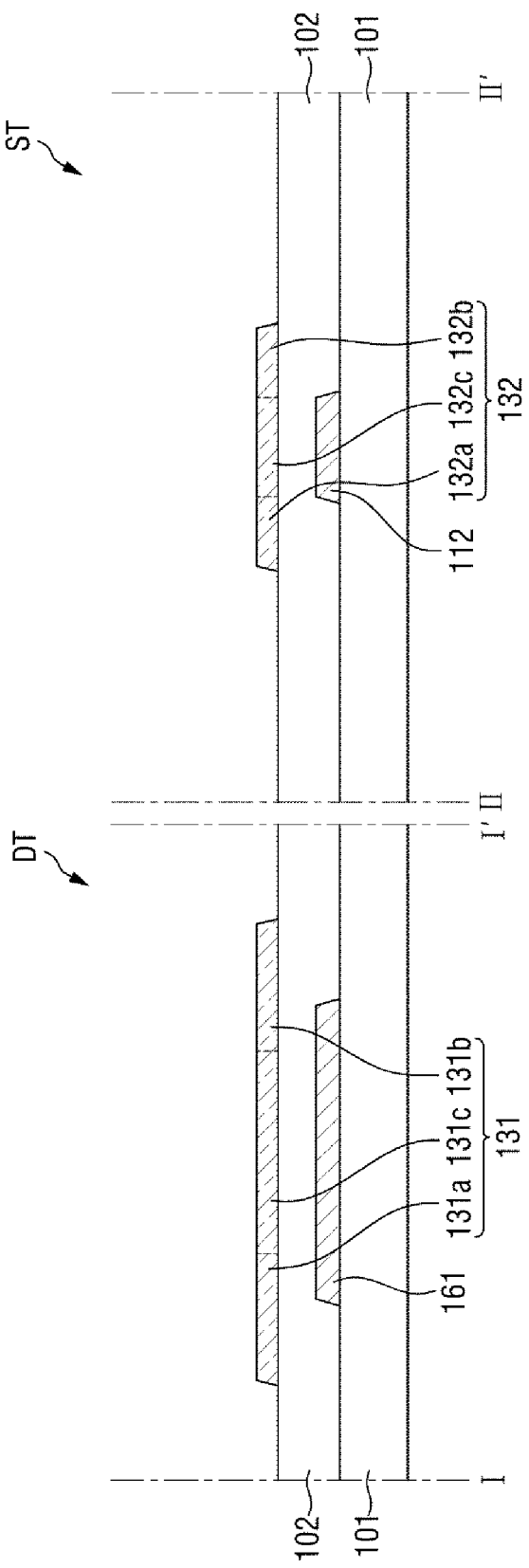

Next, referring to FIGS. 17 and 20, the first active layer 131 and a second active layer 132 are formed on the first insulating layer 102 (step S103).

Specifically, the first active layer 131 and the second active layer 132 may be formed by forming an active layer on the entire surface of the first insulating layer 102 and then patterning the active layer.

The active layer may be an oxide semiconductor. For example, the active layer may be an oxide semiconductor containing tin (Sn). In this case, the active layer may be indium-gallium-zinc oxide or indium-tin-zinc oxide. The active layer may be formed by sputtering.

The first active layer 131 and the second active layer 132 may be formed by patterning the active layer in an etching process using a photoresist pattern. The active layer may be patterned by wet etching or dry etching. Then, the photoresist may be removed by a strip process.

Since the first active layer 131 and the second active layer 132 are simultaneously formed by patterning the active layer, the number of masks can be maintained, thus ensuring process economics.

Figure 21:
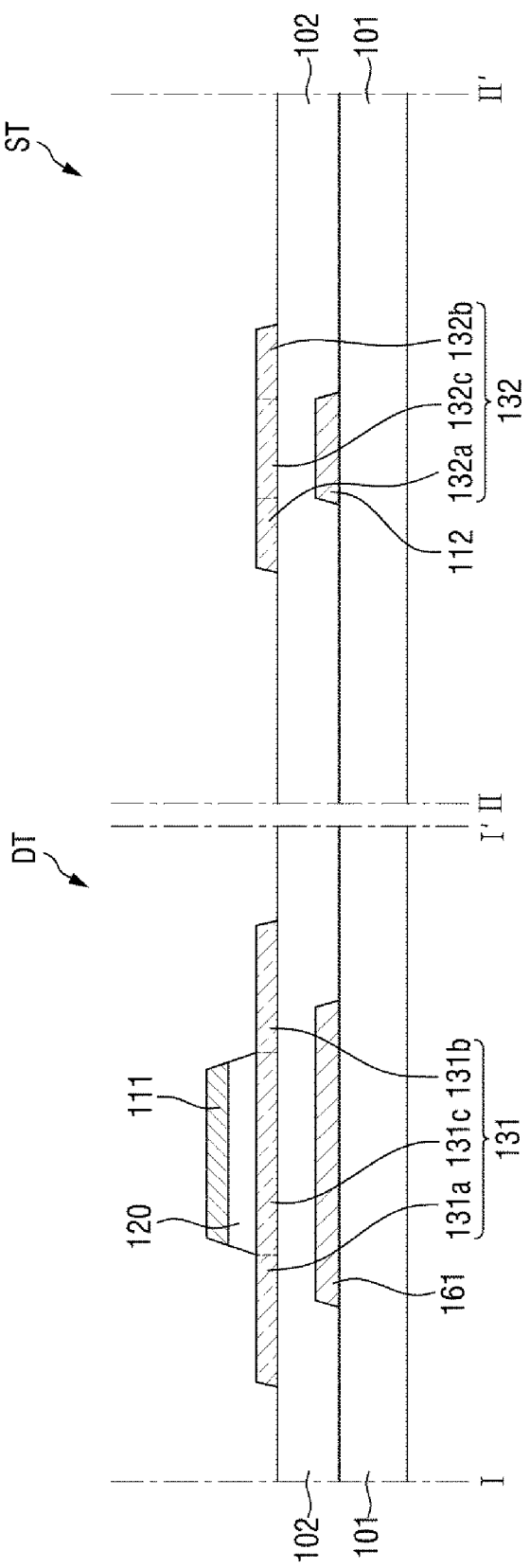

Next, referring to FIGS. 17 and 21, a first gate insulating layer 120 and a first gate electrode 111 are formed on the first active layer 131 (step S104).

The first gate insulating layer 120 may be an inorganic layer, for example, a silicon oxide (SiOx) layer, a silicon nitride (SiNx) layer, or a multilayer composed of these layers. The first gate insulating layer 120 may be formed by chemical vapor deposition.

The first gate electrode 111 may be a single layer or a multilayer made of any one or more of molybdenum (Mo), aluminum (Al), chromium (Cr), gold (Au), titanium (Ti), nickel (Ni), neodymium (Nd), copper (Cu), and alloys of these materials. The first gate electrode 111 may be formed by patterning a gate metal layer, which is formed on the entire surface of the first gate insulating layer 120 by sputtering, in an etching process using a photoresist pattern.

The first gate insulating layer 120 may be etched and patterned by using the first gate electrode 111 as a mask.

Figure 22:
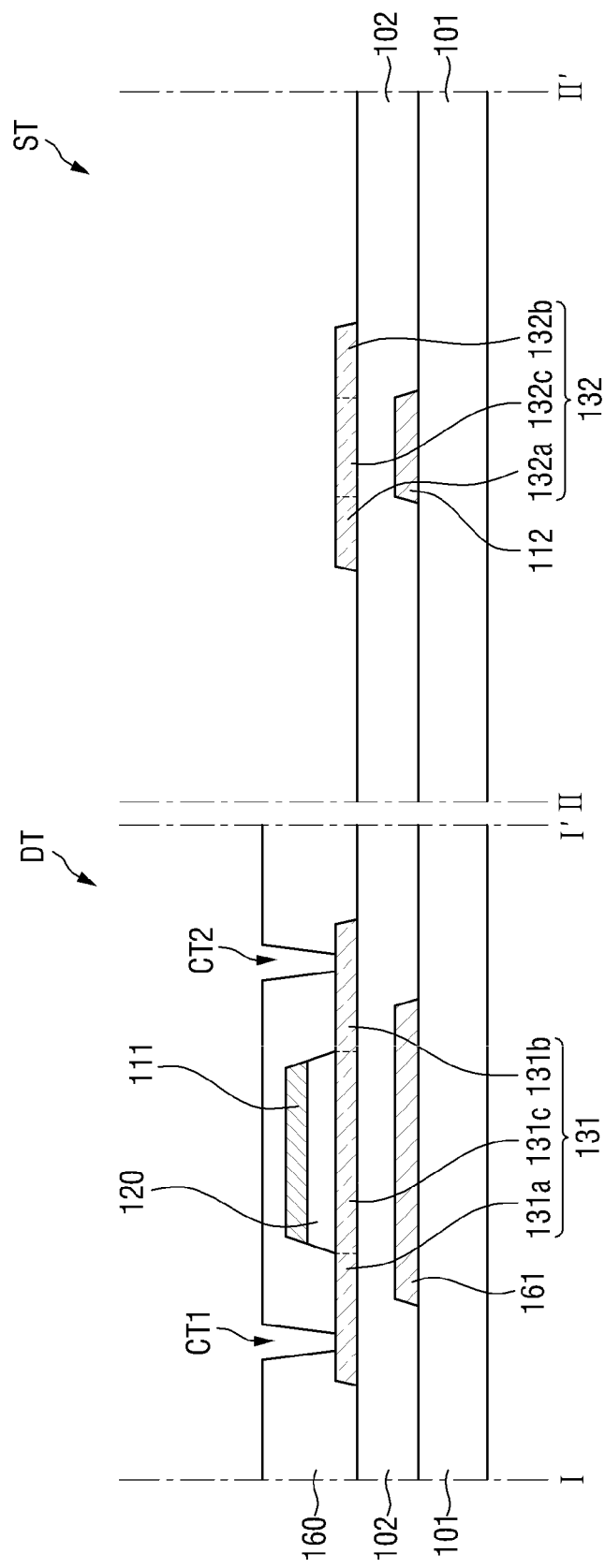

Next, referring to FIGS. 17 and 22, a second insulating layer 160 including a first contact hole CT1 and a second contact hole CT2 is formed on the first gate electrode 111 (step S105).

The second insulating layer 160 may be an inorganic layer, for example, a silicon oxide (SiOx) layer, a silicon nitride (SiNx) layer, or a multilayer composed of these layers. The second insulating layer 160 may be formed by chemical vapor deposition.

The first contact hole CT1 passing through the second insulating layer 160 to expose a portion of an upper surface of the first active layer 131 and the second contact hole CT2 passing through the second insulating layer 160 to expose another portion of the upper surface of the first active layer 131 may be formed in the second insulating layer 160.

The second insulating layer 160 may not be formed on the first substrate 101 of the switching transistor ST. That is, the first substrate 101 of the switching transistor ST may not overlap the second insulating layer 160. Accordingly, the second active layer 132 of the switching transistor ST may not overlap the second insulating layer 160, and upper and side surfaces of the second active layer 132 may be exposed to the outside.

Figure 23:
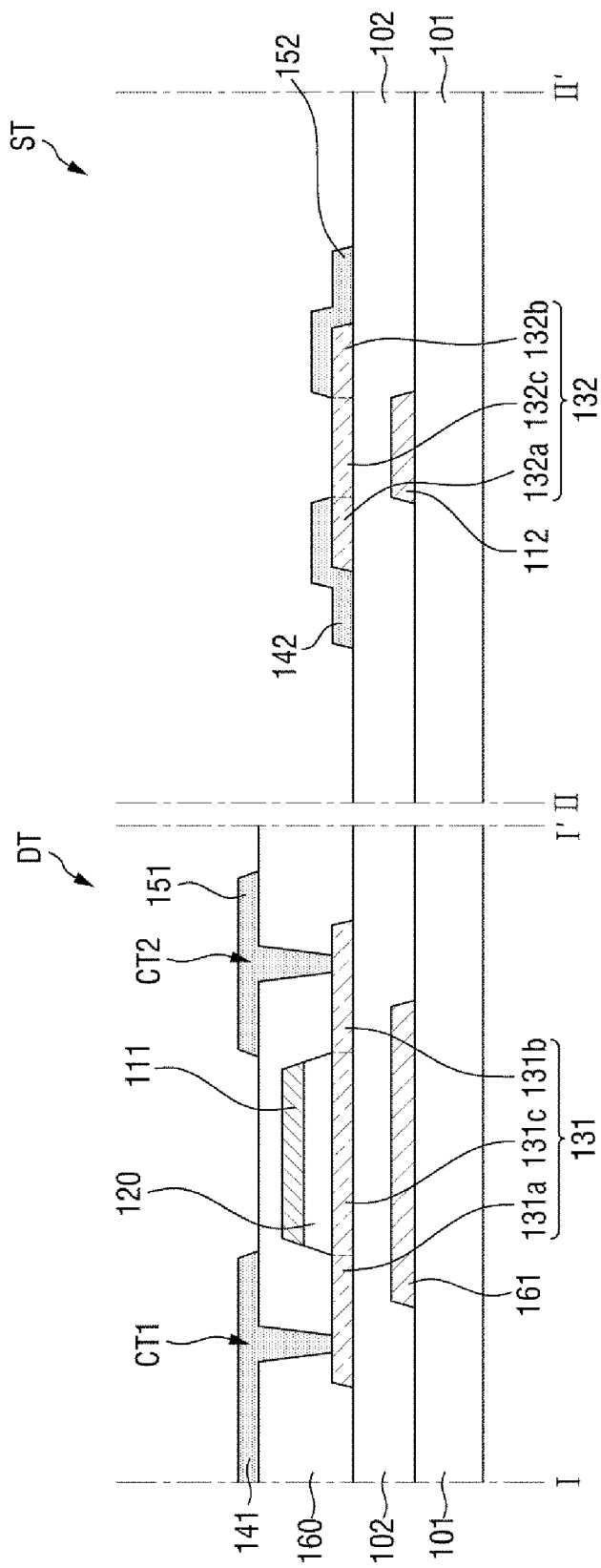

Next, referring to FIGS. 17 and 23, a first source electrode 141, a second source electrode 142, a first drain electrode 151 and a second drain electrode 152 are formed on the second insulating layer 160 and the second active layer 132 (step S106).

Each of the first source electrode 141, the second source electrode 142, the first drain electrode 151 and the second drain electrode 152 may be a single layer or a multilayer made of any one or more of molybdenum (Mo), aluminum (Al), chromium (Cr), gold (Au), titanium (Ti), nickel (Ni), neodymium (Nd), copper (Cu), and alloys of these materials. The first source electrode 141, the second source electrode 142, the first drain electrode 151 and the second drain electrode 152 may be formed by patterning a source drain metal layer, which is formed on the entire surface of the second insulating layer 160 by sputtering, in an etching process using a photoresist pattern.

The first source electrode 141 may be formed to contact a first source region 131a formed on a side of the first active layer 131 through the first contact hole CT1. The first drain electrode 151 may be formed to contact a first drain region 131b formed on the other side of the first active layer 131 through the second contact hole CT2.

The second source electrode 142 may be formed to contact a second source region 132a formed on a side of the second active layer 132. The second drain electrode 152 may be formed to contact a second drain region 132b formed on the other side of the second active layer 132. An etchant used to pattern the source drain metal layer to form the second source electrode 142 and the second drain electrode 152 of the switching transistor ST may be an etchant having a selectivity for selectively etching the source drain metal layer while minimizing an etch rate of the second active layer 132 which is an oxide semiconductor.

Figure 24:
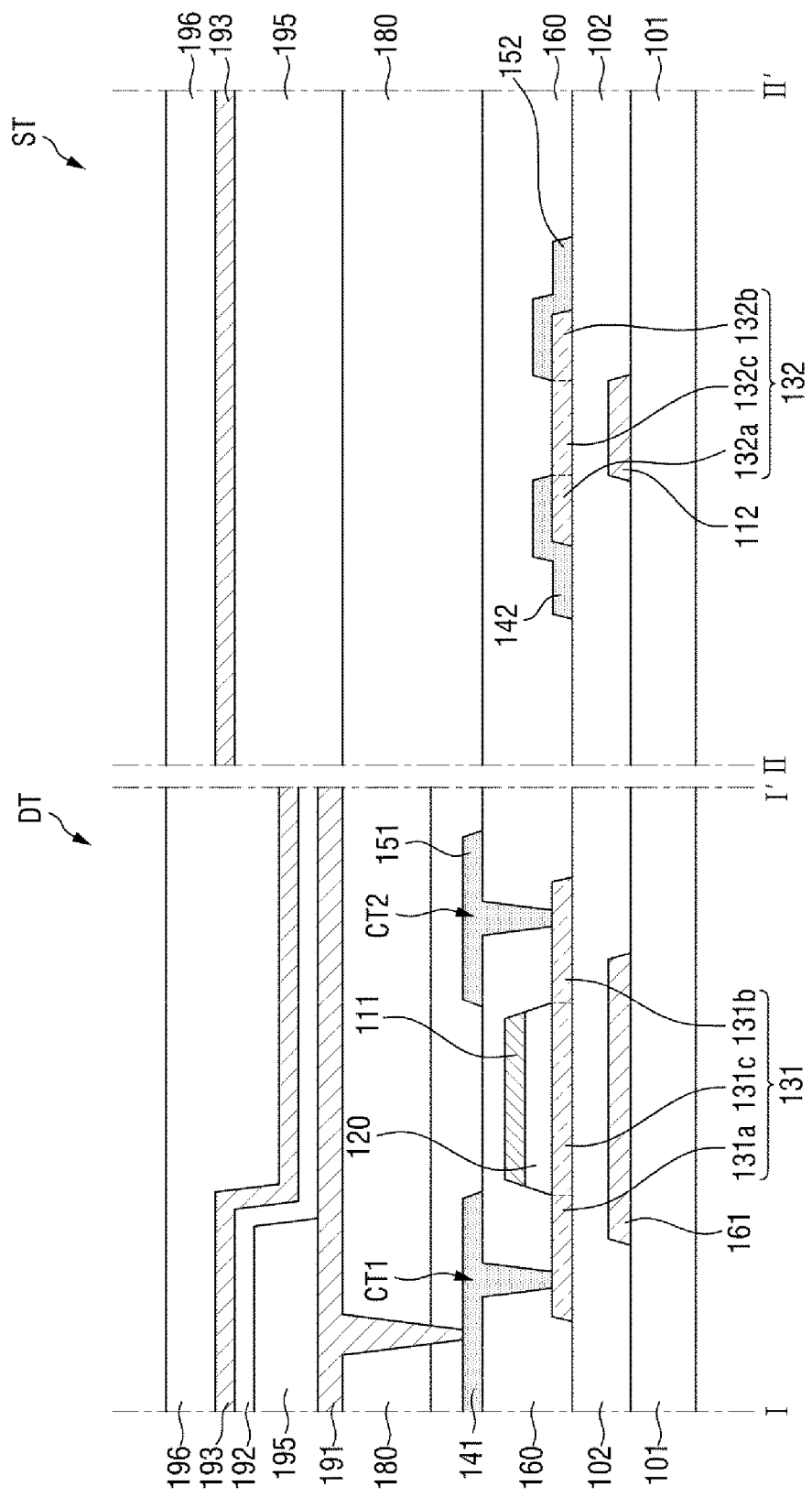

Next, referring to FIGS. 17 and 24, a first protective layer 170, a first planarization layer 180, etc. are formed on the first source electrode 141, the second source electrode 142, the first drain electrode 151 and the second drain electrode 152, thereby completing a display device (step S107).

The first protective layer 170 may be an inorganic layer, for example, a silicon oxide (SiOx) layer, a silicon nitride (SiNx) layer, or a multilayer composed of these layers. The first protective layer 170 may be formed by chemical vapor deposition.

The first planarization layer 180 may be formed on the protective layer 170 to flatten steps due to thin-film transistors such as the driving transistor DT and the switching transistor ST. The first planarization layer 180 may be made of an organic layer such as acryl resin, epoxy resin, phenolic resin, polyamide resin, or polyimide resin.

As described above, the driving transistor DT has the top gate structure, and the switching transistor ST has the bottom gate structure. Therefore, it is possible to ensure the reliability of the display device while reducing the area of the switching transistor ST, thus realizing a high-resolution display device.

Further, since the first active layer 131 of the driving transistor DT and the second active layer 132 of the switching transistor ST are disposed on the same layer, the number of masks can be maintained, thus ensuring process economics.

A third gate electrode, a third active layer, a third source electrode and a third drain electrode of each of a pull-up transistor TU, a pull-down transistor TD and a plurality of transistors of a node controller NC of a scan driver circuit SDC may be formed substantially the same as the second gate electrode 112, the second active layer 132, the second source electrode 142 and the second drain electrode 152 of the switching transistor ST described above, and thus a detailed description thereof is omitted to avoid redundancy.

For ease of description, a first switching transistor and a second switching transistor of the scan driver circuit SDC are referred to as the pull-up transistor TU and the pull-down transistor TD of the scan driver circuit SDC.

Since the transistors of the scan driver circuit SDC are formed to have the same bottom gate structure as the switching transistor ST, an increase in the width of the scan driver circuit SDC can be prevented even if a high-resolution display device is realized.

A method of manufacturing a display device according to an exemplary embodiment will now be described. In the following exemplary embodiment, elements identical to those described above will be indicated by the same reference numerals, and a redundant description thereof will be omitted or discussed briefly to avoid redundancy.

Figure 25:
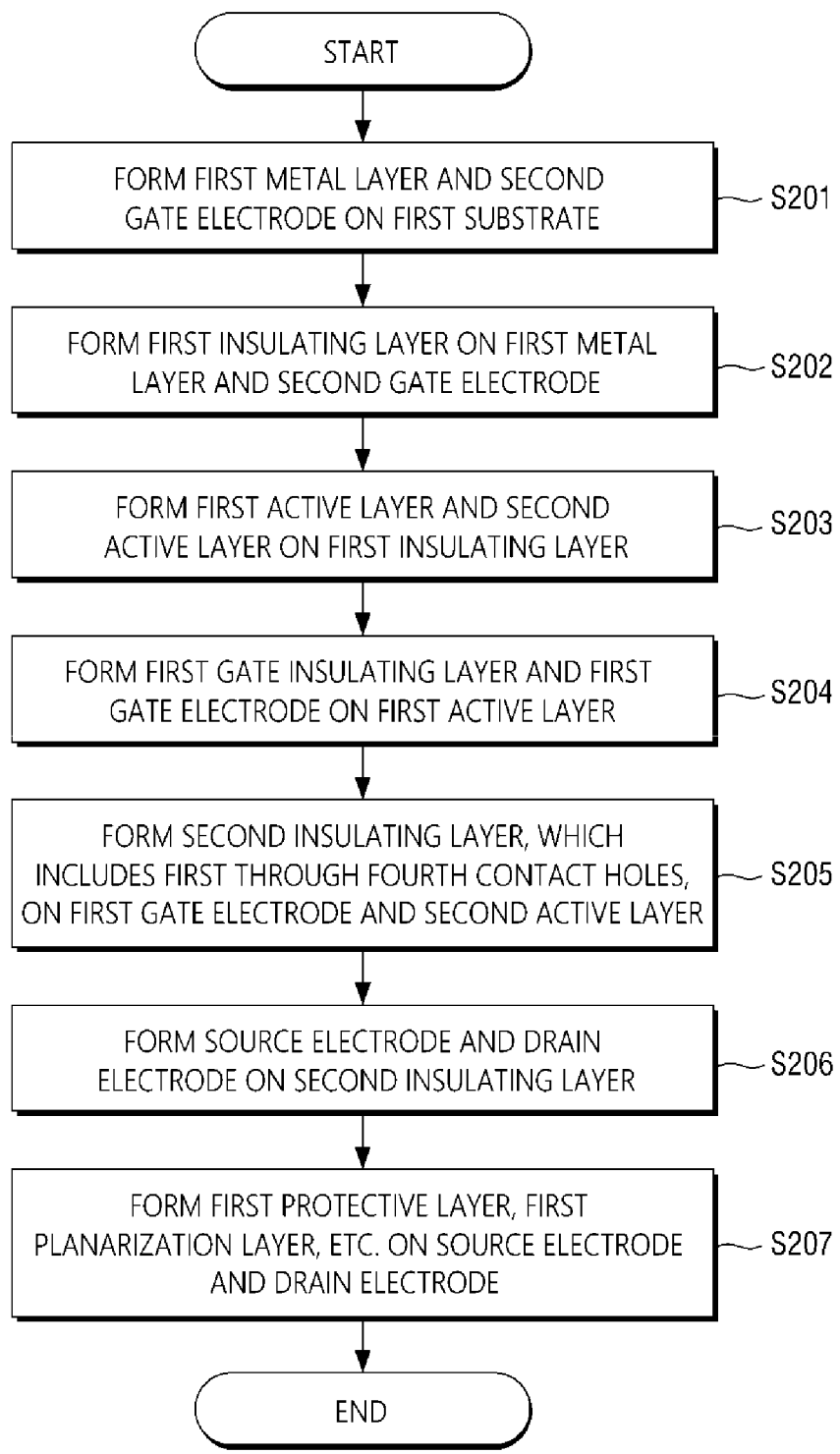
FIG. 25 is a flowchart illustrating another exemplary embodiment of a method of manufacturing a display device according to the principles of the invention.
Figure 26:
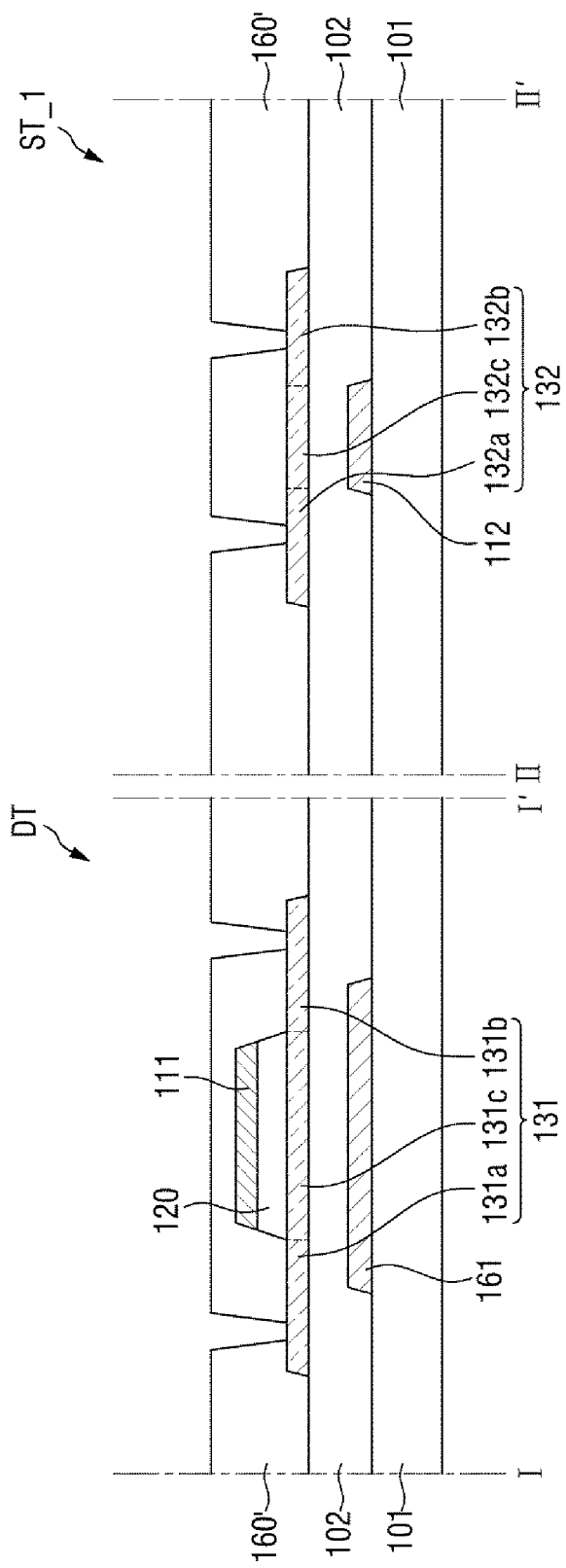
FIGS. 26 and 27 are cross-sectional views illustrating certain steps in the method of manufacturing a display device of FIG. 25.
Figure 27:
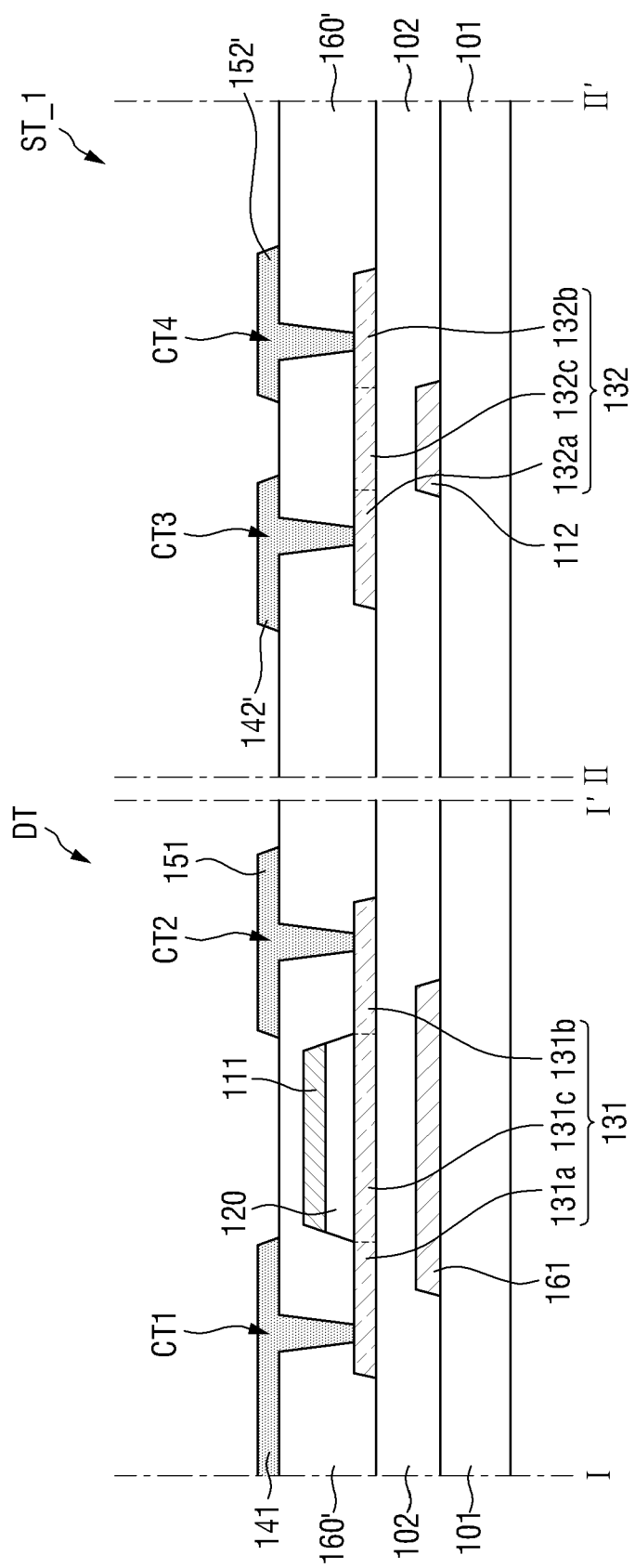

FIG. 25 is a flowchart illustrating another exemplary embodiment of a method of manufacturing a display device according to the principles of the invention. FIGS. 26 and 27 are cross-sectional views illustrating certain steps in the method of manufacturing a display device of FIG. 25. Each of FIGS. 26 and 27 includes a cross section of I-I' shown in FIG. 6 and a cross section of II-II' shown in FIG. 12.

Steps S205 and S206 of the exemplary embodiment of FIGS. 25, 26 and 27 are different from those of the exemplary embodiment of FIGS. 17, 22 and 23.

Steps S201 through S204 and S207 of FIG. 25 are substantially the same as steps S101 through S104 and S107 of FIG. 17, and thus a detailed description thereof is omitted to avoid redundancy.

Referring to FIGS. 25 and 26, a second insulating layer 160' including first through fourth contact holes CT1 through CT4 is formed on a first gate electrode 111 and a second active layer 132 (step S205).

The second insulating layer 160' may be an inorganic layer, for example, a silicon oxide (SiOx) layer, a silicon nitride (SiNx) layer, or a multilayer composed of these layers. The second insulating layer 160' may be formed by chemical vapor deposition.

The first contact hole CT1 passing through the second insulating layer 160' to expose a portion of an upper surface of a first active layer 131 and the second contact hole CT2 passing through the second insulating layer 160' to expose another portion of the upper surface of the first active layer 131 may be formed in the second insulating layer 160'.

In addition, the third contact hole CT3 passing through the second insulating layer 160' to expose a portion of an upper surface of the second active layer 132 and the fourth contact hole CT4 passing through the second insulating layer 160' to expose another portion of the upper surface of the second active layer 132 may be formed in the second insulating layer 160'.

Next, referring to FIGS. 25 and 27, a first source electrode 141, a second source electrode 142, a first drain electrode 151 and a second drain electrode 152 are formed on the second insulating layer 160' (step S206).

Each of the first source 141, the second source electrode 142, the first drain electrode 151 and the second drain electrode 152 may be a single layer or a multilayer made of any one or more of molybdenum (Mo), aluminum (Al), chromium (Cr), gold (Au), titanium (Ti), nickel (Ni), neodymium (Nd), copper (Cu), and alloys of these materials. The first source electrode 141, the second source electrode 142, the first drain electrode 151 and the second drain electrode 152 may be formed by patterning a source drain metal layer, which is formed on the entire surface of the second insulating layer 160' by sputtering, in an etching process using a photoresist pattern.

The first source electrode 141 may be formed to contact a first source region 131a formed on a side of the first active layer 131 through the first contact hole CT1. The first drain electrode 151 may be formed to contact a first drain region 131b formed on the other side of the first active layer 131 through the second contact hole CT2.

In addition, the second source electrode 142 may be formed to contact a second source region 132a formed on a side of the second active layer 132 through the third contact hole CT3. The second drain electrode 152 may be formed to contact a second drain region 132b formed on the other side of the second active layer 132 through the fourth contact hole CT4.

As described above, since a switching transistor ST_1 has the etch-stopper structure, the second insulating layer 160' is formed on the second active layer 132 of the switching transistor ST_1. Therefore, the second active layer 132 can be prevented from being damaged when the second source electrode 142 and the second drain electrode 152 are patterned formed by patterning the source drain metal layer.

Since the switching transistor ST_1 has the bottom gate structure, the area of the switching transistor ST_1 can be reduced. Therefore, a high-resolution display device with a greater number of pixels per given area can be realized as described above.

A third gate electrode, a third active layer, a third source electrode and a third drain electrode of each of a pull-up transistor TU, a pull-down transistor TD and a plurality of transistors of a node controller NC of a scan driver circuit SDC may be formed substantially the same as a second gate electrode 112, the second active layer 132, the second source electrode 142 and the second drain electrode 152 of the switching transistor ST_1 according to the illustrated exemplary embodiment, and thus a detailed description thereof is omitted to avoid redundancy.

According to exemplary embodiments, it is possible to ensure process economics by maintaining the number of masks, to realize a narrow bezel by reducing the width of a scan driver circuit, and to realize a high-resolution display device by reducing the area of a switching transistor.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a first insulating layer disposed on a substrate, the first insulating layer including a first surface facing the substrate and a second surface opposite to the first surface;
   a first metal layer disposed between the substrate and the first surface of the first insulating layer; and
   a plurality of pixels disposed on the substrate and respectively coupled to scan lines and data lines intersecting the scan lines,
   wherein at least some of the pixels comprise:
   a driving transistor including a first active layer disposed directly on the second surface of the first insulating layer, a first gate electrode disposed on the first active layer, and a first source electrode and a first drain electrode electrically connected to the first active layer, the first drain electrode being spaced apart from the first source electrode by a first distance, wherein the first source electrode is connected to the first active layer through a first contact hole and is connected to the first metal layer through a fifth contact hole, and
   a switching transistor including a second gate electrode disposed between the substrate and the first surface of the first insulating layer, a second active layer disposed directly on the second surface of the first insulating layer and a second source electrode and a second drain electrode electrically connected to the second active layer, the second drain electrode being spaced apart from the second source electrode by a second distance different from the first distance,
   wherein the second gate electrode is disposed between the substrate and the second active layer,
   wherein the first active layer and the second active layer directly contact the second surface of the first insulating layer, and
   wherein the first metal layer and the second gate electrode directly contact the first insulating layer.

2. The display device of claim 1, wherein the first active layer and the second active layer comprise indium-gallium-zinc oxide or indium-tin-zinc oxide.

3. The display device of claim 1, wherein the first active layer comprises a first source region, a first drain region and a first channel region disposed between the first source region and the first drain region, and the second active layer comprises a second source region, a second drain region and a second channel region disposed between the second source region and the second drain region.

4. The display device of claim 1, wherein a length of the first active layer in a first direction is greater than that of the second active layer in the first direction.

5. The display device of claim 1, wherein the driving transistor further comprises a top gate structure, and the first metal layer and the second gate electrode comprise the same material.

6. The display device of claim 5, further comprising:
   a second insulating layer disposed on the first gate electrode,
   wherein the first source electrode and the first drain electrode are disposed directly on the second insulating layer,
   wherein the first source electrode is connected to a first source region of the first active layer through the first contact hole passing through the second insulating layer; and the first drain electrode is connected to a first drain region of the first active layer through a second contact hole passing through the second insulating layer.

7. The display device of claim 6, wherein the first source electrode contacts the first metal layer through the fifth contact hole passing through the first insulating layer and the second insulating layer.

8. The display device of claim 6, wherein the second insulating layer further comprises a third contact hole and a fourth contact hole which at least partially overlap the second active layer of the switching transistor and pass through the second insulating layer, and wherein the second source electrode is connected to a second source region of the second active layer through the third contact hole and the second drain electrode is connected to a second drain region of the second active layer through the fourth contact hole.

9. The display device of claim 8, wherein the first distance between the first source electrode and the first drain electrode in a first direction is greater than the second distance between the second source electrode and the second drain electrode in the first direction.

10. The display device of claim 1, further comprising a scan driver circuit to output a scan signal to the scan lines, wherein the scan driver circuit comprises a pull-up transistor to output a gate-on voltage when a pull-up node is charged with the gate-on voltage, the pull-up transistor having a third gate electrode disposed between the substrate and the first insulating layer and a third active layer disposed on the same layer as the first active layer.

11. The display device of claim 10, wherein the third active layer comprises indium-gallium-zinc oxide or indium-tin-zinc oxide.

12. The display device of claim 11, further comprising:
a second insulating layer disposed on the first gate electrode,
wherein the second insulating layer does not overlap the third active layer of the pull-up transistor.

\* \* \* \* \*